(12) United States Patent (10) Patent No.: US 8,386,895 B2
Maccarrone et al. (45) Date of Patent: Feb. 26, 2013

(54) ENHANCED MULTILEVEL MEMORY

(75) Inventors: Marco Maccarrone, Palestro (IT); Guido Lomazzi, Catronno (IT); Ilaria Motta, Cassolnovo (IT)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 12/783,483

(22) Filed: May 19, 2010

(65) Prior Publication Data

US 2011/0289376 A1 Nov. 24, 2011

(51) Int. Cl.
  *H03M 13/03* (2006.01)
(52) U.S. Cl. ......................................... 714/786
(58) Field of Classification Search .................. None
  See application file for complete search history.

(56) References Cited

U.S. PATENT DOCUMENTS

| | | | |
|---|---|---|---|
| 4,112,502 A | 9/1978 | Scheuneman | |
| 5,272,706 A | 12/1993 | Park | |
| 5,942,004 A | 8/1999 | Cappelletti | |
| 5,956,743 A | 9/1999 | Bruce et al. | |
| 6,023,781 A | 2/2000 | Hazama | |
| 6,128,222 A | 10/2000 | Moreaux | |
| 6,175,522 B1 | 1/2001 | Fang | |
| 6,279,133 B1 | 8/2001 | Vafai et al. | |
| 6,591,394 B2 | 7/2003 | Lee, et al. | |
| 6,628,723 B1 | 9/2003 | Gerlach et al. | |
| 6,683,817 B2 | 1/2004 | Wei et al. | |
| 6,731,538 B2 | 5/2004 | Noda et al. | |
| 6,732,322 B1 | 5/2004 | Miyauchi et al. | |
| 6,836,431 B2 * | 12/2004 | Chang | 365/185.03 |
| 6,839,870 B2 | 1/2005 | Fanfelle et al. | |
| 6,871,303 B2 | 3/2005 | Halter | |
| 6,895,543 B2 | 5/2005 | Hazama | |
| 6,961,266 B2 * | 11/2005 | Chang | 365/185.03 |
| 7,061,804 B2 | 6/2006 | Chun et al. | |
| 7,149,951 B2 | 12/2006 | Seo | |
| 7,184,356 B2 | 2/2007 | Noguchi et al. | |
| 7,227,782 B2 | 6/2007 | Lee et al. | |
| 7,389,465 B2 | 6/2008 | Radke et al. | |
| 7,451,383 B2 | 11/2008 | Kim et al. | |
| 7,478,314 B1 | 1/2009 | Cheong et al. | |
| 7,643,342 B2 | 1/2010 | Litsyn et al. | |
| 7,739,576 B2 | 6/2010 | Radke | |
| 7,836,364 B1 * | 11/2010 | Sutardja et al. | 714/723 |
| 7,844,879 B2 * | 11/2010 | Ramamoorthy et al. | 714/763 |
| 7,860,200 B2 | 12/2010 | Furman et al. | |

(Continued)

FOREIGN PATENT DOCUMENTS

JP 2000149592 5/2000
KR 100766042 10/2007

(Continued)

OTHER PUBLICATIONS

Chris Winstead, "Analog Soft Decoding for Multi-level Memories," Proceedings of the 35th International Symposium on Multiple-Valued Logic (ISMVL '05), 2005, 6 pages.

(Continued)

*Primary Examiner* — Guerrier Merant
(74) *Attorney, Agent, or Firm* — Knobbe Martens Olson & Bear LLP

(57) ABSTRACT

Subject matter disclosed herein relates to semiconductor memories and, more particularly, to multilevel non-volatile or volatile memories.

23 Claims, 17 Drawing Sheets

U.S. PATENT DOCUMENTS

| | | | |
|---|---|---|---|
| 7,904,780 | B2 | 3/2011 | Brandman |
| 7,962,831 | B2 | 6/2011 | Park et al. |
| 7,975,209 | B2 * | 7/2011 | Chin et al. ............... 714/780 |
| 8,023,334 | B2 * | 9/2011 | Hoei et al. ............ 365/185.24 |
| 8,046,542 | B2 | 10/2011 | Radke |
| 8,051,358 | B2 | 11/2011 | Radke |
| 8,065,583 | B2 | 11/2011 | Radke |
| 8,194,441 | B2 | 6/2012 | Thiruvengadam |
| 2002/0120820 | A1 | 8/2002 | Higuchi et al. |
| 2003/0002334 | A1 * | 1/2003 | Ho Chang ............ 365/185.03 |
| 2003/0088821 | A1 | 5/2003 | Yokokawa et al. |
| 2003/0112879 | A1 | 6/2003 | Antia et al. |
| 2003/0156454 | A1 | 8/2003 | Wei et al. |
| 2004/0268065 | A1 | 12/2004 | Hilton et al. |
| 2005/0038953 | A1 * | 2/2005 | Chang ........................ 711/5 |
| 2005/0114587 | A1 | 5/2005 | Chou et al. |
| 2006/0221752 | A1 | 10/2006 | Fasoli et al. |
| 2007/0061689 | A1 | 3/2007 | Park et al. |
| 2007/0124647 | A1 | 5/2007 | Chen et al. |
| 2007/0171714 | A1 | 7/2007 | Wu et al. |
| 2007/0171730 | A1 * | 7/2007 | Ramamoorthy et al. 365/185.33 |
| 2007/0266295 | A1 | 11/2007 | Conley |
| 2007/0266296 | A1 | 11/2007 | Conley |
| 2008/0010582 | A1 | 1/2008 | Nieto et al. |
| 2008/0034272 | A1 | 2/2008 | Wu et al. |
| 2008/0137414 | A1 | 6/2008 | Park et al. |
| 2008/0163023 | A1 | 7/2008 | Hong et al. |
| 2008/0168319 | A1 | 7/2008 | Lee et al. |
| 2008/0244360 | A1 * | 10/2008 | Mokhlesi et al. ............ 714/758 |
| 2008/0250300 | A1 * | 10/2008 | Mokhlesi et al. ............ 714/780 |
| 2008/0294960 | A1 | 11/2008 | Sharon et al. |
| 2008/0320361 | A1 | 12/2008 | Fukuda et al. |
| 2008/0320373 | A1 | 12/2008 | Kim et al. |
| 2009/0013233 | A1 | 1/2009 | Radke |
| 2009/0013234 | A1 | 1/2009 | Radke |
| 2009/0024905 | A1 * | 1/2009 | Shalvi et al. ............... 714/773 |
| 2009/0037627 | A1 | 2/2009 | Rofougaran |
| 2009/0100307 | A1 | 4/2009 | Lee |
| 2009/0129169 | A1 | 5/2009 | Roohparvar et al. |
| 2009/0132755 | A1 | 5/2009 | Radke |
| 2009/0132889 | A1 | 5/2009 | Radke |
| 2009/0241009 | A1 * | 9/2009 | Kong et al. ............... 714/763 |
| 2009/0282184 | A1 * | 11/2009 | Dutta et al. ............... 711/103 |
| 2010/0023800 | A1 | 1/2010 | Harari et al. |
| 2010/0115376 | A1 | 5/2010 | Shalvi et al. |
| 2010/0199149 | A1 * | 8/2010 | Weingarten et al. .......... 714/773 |
| 2010/0199153 | A1 | 8/2010 | Okamura et al. |
| 2011/0060969 | A1 * | 3/2011 | Ramamoorthy et al. ..... 714/773 |
| 2011/0103145 | A1 * | 5/2011 | Sarin et al. ............... 365/185.03 |
| 2011/0113303 | A1 * | 5/2011 | Bedeschi et al. ............. 714/763 |

FOREIGN PATENT DOCUMENTS

| | | |
|---|---|---|
| WO | WO 2004062113 | 7/2004 |
| WO | WO 2006070668 | 7/2006 |
| WO | WO 2007084751 | 7/2007 |

OTHER PUBLICATIONS

Ungerboeck, Channel Coding with Multilevel/Phase Signals, IEEE Transactions on Information Theory, Jan. 1982, 13 pgs., vol. IT-28, No. 1.

Ungerboeck, Trellis-Coded Modulation with Redundant Signal Sets Part I: Introduction, IEEE Communications Magazine, Feb. 1987, 7 pgs., vol. 25, No. 2.

Ungerboeck, Trellis-Coded Modulation with Redundant Signal Sets Part II: State of the Art, IEEE Communications Magazine, Feb. 1987, pp. 12-21, vol. 25, No. 2.

Daneshgaran, et al.; "An extensive search for good punctured rate-k/(k+1) recursive convolutional codes for serially concatenated convolutional codes," Information Theory, IEEE Transactions on, vol. 50, No. 1, pp. 208-217, Jan. 2004.

Frenger, et al.; "zRate-compatible convolutional codes for multirate DS-CDMA systems," Communications, IEEE Transactions on, vol. 47, No. 6, pp. 828-836, Jun 1999.

Ohtsuki, T.; "Rate adaptive indoor infrared wireless communication systems using repeated and punctured convolutional codes," Communications, 1999. ICC '99. 1999 IEEE International Conference on, vol. 1, No. pp. 609-613 vol. 1, 1999.

Zhou, et al.; "High rate turbo code using unevenly punctured convolutional constituent code," Communications, 1999. APCC/OECC '99. Fifth Asia-Pacific Conference on . . . and Fourth Optoelectronics and Communications Conference, vol. 1, No. pp. 751-754 vol. 1, 1999.

Korean Intellectual Property Office; "Notification of Transmittal of the International Search Report and the Written Opinion of the International Searching Authority, or the Declaration", "Written Opinion of the International Searching Authority", and "International Search Report" of corresponding PCT application PCT/US2008/068236, filed Jun. 25, 2008; mailed Jan. 20, 2009.

The International Bureau of WIPO; International Preliminary Report on Patentability of related PCT Application No. PCT/US2008/068236, filed Jun. 25, 2008; mailing date Jan. 21, 2010; Geneva, Switzerland.

Korean Intellectual Property Office; "Notification of Transmittal of the International Search Report and the Written Opinion of the International Searching Authority, or the Declaration", "Written Opinion of the International Searching Authority", and "International Search Report" of corresponding PCT application PCT/US2008/068240, filed Jun. 25, 2008; mailed Dec. 29, 2008.

The International Bureau of WIPO; International Preliminary Report on Patentability of related PCT Application No. PCT/US2008/068240, filed Jun. 25, 2008; mailing date Jan. 21, 2010; Geneva, Switzerland.

Korean Intellectual Property Office; "Notification of Transmittal of the International Search Report and the Written Opinion of the International Searching Authority, or the Declaration", "Written Opinion of the International Searching Authority", and "International Search Report" of corresponding PCT application PCT/US2008/081475, filed Oct. 28,2008; mailed Feb. 18, 2009; Daejeon, Republic of Korea.

Korean Intellectual Property Office; "Notification of Transmittal of the International Search Report and the Written Opinion of the International Searching Authority, or the Declaration", "Written Opinion of the International Searching Authority", and "International search report" of related International Application PCT/US2008/081743, filed Oct. 28,2008; Dated Feb. 19, 2009; Daejeon, Republic of Korea.

Korean Intellectual Property Office; "Notification of Transmittal of the International Search Report and the Written Opinion of the International Searching Authority, or the Declaration", "Written Opinion of the International Searching Authority", and "International search report" of related International Application PCT/US2008/081479, filed Oct. 28, 2008; mailed Jun. 29, 2009.

European Patent Office; Extended European Search Report of related European Application, Application No. 08852229.7; mailed on Dec. 9, 2011.

European Patent Office; Extended European Search Report of related European Application, Application No. 08851231.4; Mailing date Jan. 30, 2012.

European Patent Office; Extended European Search Report of related European Application, Application No. 08854324.4; Mailing date Jun. 6, 2011.

Chinese State Intellectual Property Office; Office Action of related Chinese Application No. 200880117050.0; Mailing date Jun. 6, 2012.

USPTO; Office Action dated Apr. 12, 2011, from related U.S. Appl. No. 11/774,316, filed Jul. 6, 2007.

USPTO; Office Action dated Nov. 30, 2011; from related U.S. Appl. No. 13/267,262, filed Oct. 6, 2011.

USPTO; Office Action dated Jan. 11, 2011; from related U.S. Appl. No. 11/774,377, filed Jul. 6, 2007.

USPTO; Office Action dated May 16, 2011; from related U.S. Appl. No. 11/774,377, filed Jul. 6, 2007.

USPTO; Office Action dated Dec. 9, 2011; from U.S. Appl. No. 13/281,007, filed Oct. 25, 2011.

USPTO; Office Action dated Mar. 15, 2012; from U.S. Appl. No. 11/943,943; filed Nov. 21, 2007.

USPTO; Office Action dated Sep. 9, 2010; from U.S. Appl. No. 11/944,023, filed Nov. 21, 2007.

USPTO; Final Office Action dated Dec. 9, 2010; from U.S. Appl. No. 11/944,023; filed Nov. 21, 2007.
USPTO; Office Action dated Oct. 3, 2011; from U.S. Appl. No. 13/154,150, filed Jun. 6, 2011.
USPTO; Office Action dated Mar. 1, 2012; from U.S. Appl. No. 11/944,168, filed Nov. 21, 2007.

* cited by examiner

| DCOUT | MR0 | MR0 | MR0 | MR0 |
|---|---|---|---|---|
| 0 | 000000 | | | |
| 1 | 000001 | | | |
| 2 | 000010 | | | |
| 3 | 000011 | | | |
| 4 | ⋮ | | | |
| 5 | ⋮ | | | |
| 6 | ⋮ | | | |
| 7 | 111110 | | | |
| 8 | 111111 | ⋮ | ⋮ | ⋮ |
| 9 | 111110 | | | |
| ⋮ | ⋮ | | | |
| ⋮ | ⋮ | | | |
| ⋮ | ⋮ | | | |
| 254 | 000000 | | | |
| 255 | 000000 | | | |

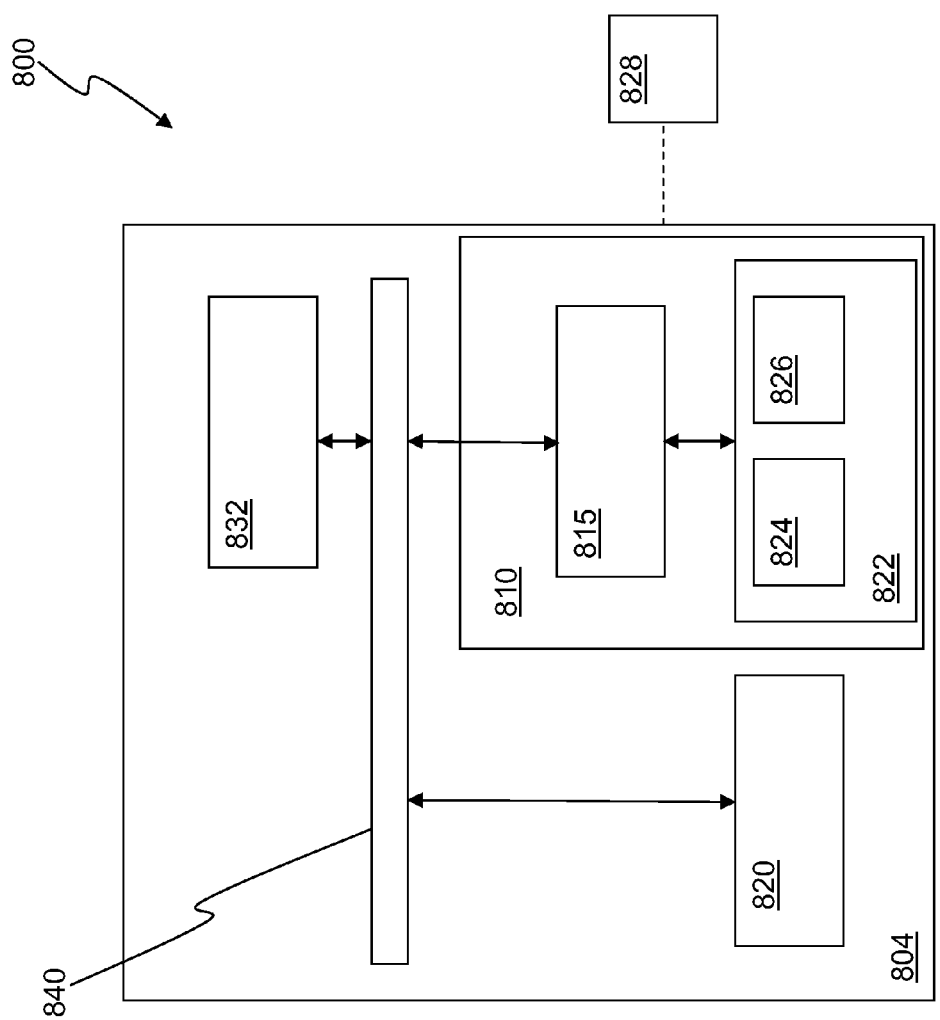

ENHANCED MULTILEVEL MEMORY

BACKGROUND

1. Field

Subject matter disclosed herein relates to semiconductor memories and, more particularly, to multilevel nonvolatile memories.

2. Information

Memory devices are employed in many types of electronic devices, such as computers, cell phones, PDA's, information loggers, and navigational equipment, just to name a few examples. Among such electronic devices, various types of nonvolatile memory devices may be employed, such as NAND or NOR flash memories, SRAM, DRAM, and phase-change memory, just to name a few examples. In general, writing or programming processes may be used to store information in such memory devices, while a read process may be used to retrieve stored information.

Storage density of a programmable memory may be increased by scaling down physical sizes of memory cells to reduce the space occupation thereof and allowing the formation of a greater number of memory cells on a same silicon area on a die integrating the memory, for example. Another way to raise storage density may involve employing a so-called "multilevel" programming scheme, wherein memory cells may be capable of storing more than one bit of information. In particular, by employing such a multilevel programming scheme, a memory cell may be programmed in any one of a number of different programming states, each one associated with a corresponding logic value. A programming state of a memory cell may be defined by a threshold voltage value of a transistor included in the memory cell. For example, for a memory cell adapted to store two bits, threshold voltage values of the memory cell may assume one of four different values. In a particular example, logic values of such a stored bit pair may correspond to a binary sequence "11", "10", "01", "00" corresponding to increasing threshold voltage values. Here, the logic value "11" may be associated with the state having the lowest threshold voltage value (erased state), and the other states may be associated in succession with states having increasing threshold voltage values. However, due to substantially unavoidable tolerances that may be intrinsic to such a memory, instead of being exactly programmed to one of four desired values, threshold voltages of programmed memory cells may be distributed among four respective program distributions—also called "populations". Accordingly, each programming state may not be associated with a single threshold voltage, but may instead be associated with a respective range of threshold voltages, defined in turn by a respective program distribution, for example.

BRIEF DESCRIPTION OF THE FIGURES

Non-limiting and non-exhaustive embodiments will be described with reference to the following figures, wherein like reference numerals refer to like parts throughout the various figures unless otherwise specified.

FIG. 7B is a look-up table implementing metric functions, according to an embodiment.

FIG. 10 is a schematic diagram of a computing system and a memory device, according to an embodiment.

DETAILED DESCRIPTION

Figure 1:
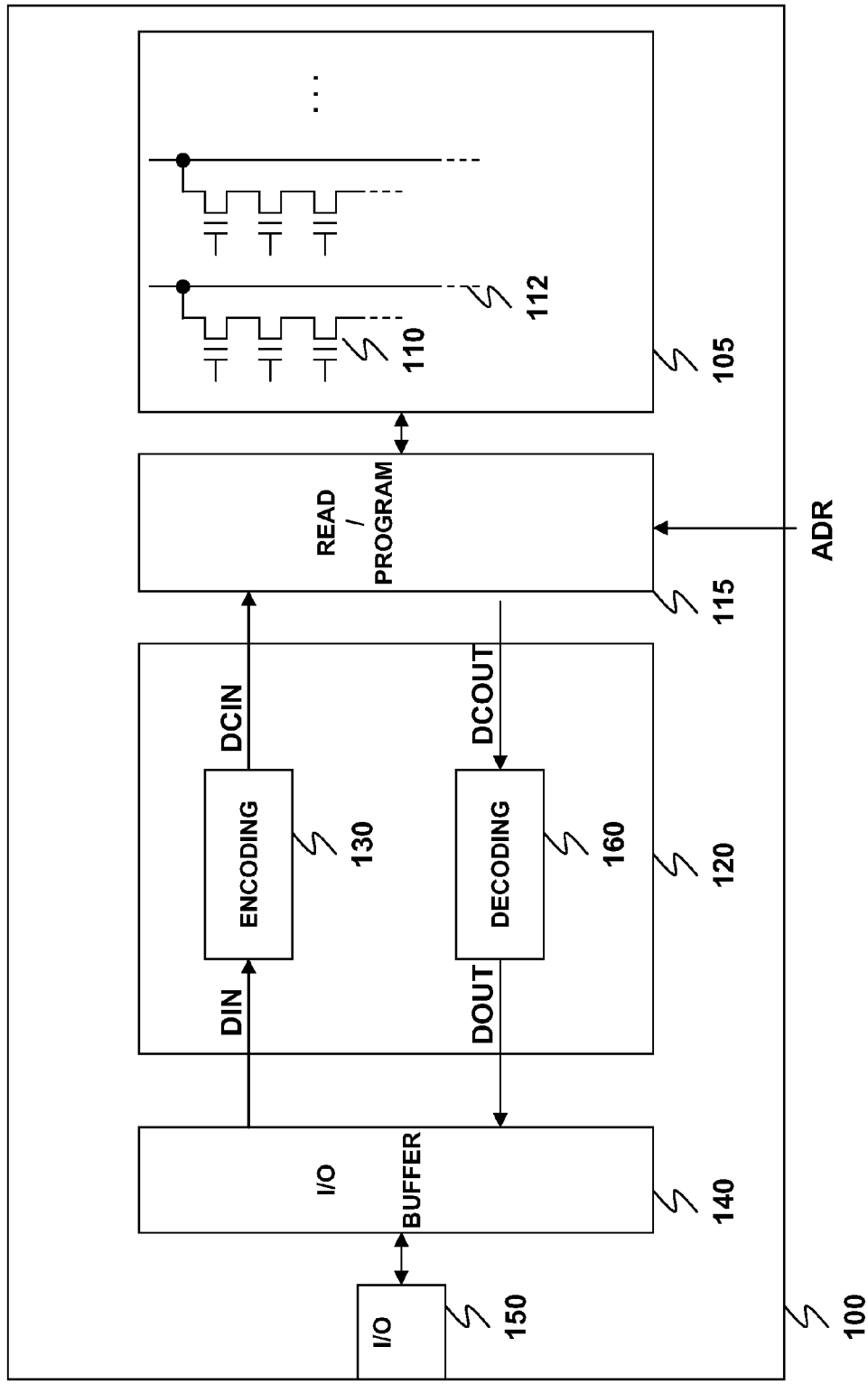
FIG. 1 is a schematic block diagram of a memory device, according to an embodiment.

Reference throughout this specification to "one embodiment" or "an embodiment" means that a particular feature, structure, or characteristic described in connection with the embodiment is included in at least one embodiment of claimed subject matter. Thus, appearances of the phrase "in one embodiment" or "an embodiment" in various places throughout this specification are not necessarily all referring to the same embodiment. Furthermore, particular features, structures, or characteristics may be combined in one or more embodiments.

In an embodiment, storage density of a memory device may be increased by incorporating multi-level memory cells capable of storing more than two programming states to represent one bit of information. Before choosing a number of different programming states to which an individual multi-level memory cell may be programmed, a designer of a memory device may consider several factors, including the value of a supply voltage of the memory device and tolerance parameters that may be intrinsic to the memory device. For example, the value of a supply voltage may define an upper level of the voltage range spanned by a set of program distributions, and a width of each program distribution may be related to tolerance parameters intrinsic to the memory device. In an embodiment, an approach to further increasing storage density may involve storing information by encoding the information according to a convolutional code to provide symbols, and storing such symbols in one or more multilevel memory cells. Retrieving such stored information may comprise applying so-called "soft decision" and convolutional decoding to such stored symbols. In another embodiment, an approach to increasing storage density may involve processing information using an error correcting code (ECC) before storing information in memory cells of a memory device. In this way, by reading content of memory cells using a soft decision approach, probability of wrong readings may be reduced even if the number of program distributions is relatively high enough to lead to partial overlaps among adjacent program distributions, as described below.

In an embodiment, a memory device may comprise a plurality of memory cells having a threshold voltage value set to one program distribution among an ordered sequence of program distributions. Such a memory device may receive first input information to be stored in a set of target memory cells. The first input information may include a first number of bits to encode the first input information into corresponding second input information. The second input information may include a second number of bits higher than the first number of bits. A memory device may be programmed to set threshold voltages of a set of target memory cells to a selected set of program distributions of the sequence according to the second input information. Program distributions of the sequence may be arranged in subsets, wherein a subset may include a plurality of program distributions that need not be consecutive program distributions in the sequence. The second input information may include a subset information portion to identify the subset to which the set of program distributions belong, as described in detail below.

FIG. 1 is a schematic block diagram of a memory 100, according to an embodiment. In particular, a non-volatile semiconductor memory 100 may comprise, for example, an electrically-programmable, non-volatile flash memory. Memory 100 may be integrated in a chip of semiconductor material (not shown in the Figure), and may include a matrix 105 of memory cells 110 to store information arranged in a plurality of rows and columns, for example. In one implementation, memory cells 110 may comprise an N-channel MOS transistor having a charge-storage element, such as a conductive floating gate to be charged by electrons, though claimed subject matter is not limited in this respect.

Memory 100 may comprise a multi-level memory. In an erased condition, a memory cell 110 may have a low threshold voltage value. Memory cell 110 may be programmed into any one of a number of states by placing particular amounts of electric charge into a floating gate of memory cell 110. Such states may be characterized by an increased threshold voltage value resulting from an increased amount of floating-gate electric charge, compared to that of a preceding state. In a particular embodiment, memory 100 may comprise a NAND architecture, wherein matrix 105 may include groups, such as groups of eight, sixteen, or more, memory cells 110 connected in series to one another to form respective memory cell strings. Different memory cells strings belonging to a same matrix column may be connected in parallel to one another to a respective bit line BL 112, though claimed subject matter is not so limited.

Memory 100 may receive an address code ADR to select a desired memory cell 110 or group of memory cells 110. The address code ADR may be provided to a read-program unit 115, which may include selector circuits and read and program circuits, such as page buffer circuits (not shown), for example. Such selector circuits may select addressed memory cells 110 while read and program circuits may execute read and program operations that may be performed on memory cells 110, for example.

In memory 100, information may be encoded before being stored in memory cells 110. For this purpose, according to an embodiment, memory 100 may include an encoding-decoding unit 120 to perform encoding operations on input signal DIN to be stored in memory cells 110 and decoding operations on output encoded signal DCOUT read from memory cells 110. More particularly, encoding-decoding unit 120 may include an encoding unit 130 to receive input signal DIN from I/O buffer 140, which may in turn be associated with I/O terminal 150 of memory 100. In one implementation, encoding-decoding unit 120 may perform encoding operations on input signal DIN and provide corresponding input encoded signal DCIN to read and program unit 115. Based, at least in part, on address code ADR, input encoded signal DCIN may then be stored in corresponding memory cells 110 of matrix 105. Encoding-decoding unit 120 may further include a decoding unit 160 to receive from read and program unit 115 the output encoded signal DCOUT read from the addressed memory cells 110, perform decoding operations thereon, and/or provide corresponding (decoded) output signal DOUT to I/O buffers 140.

In an embodiment, a system may comprise a memory device such as memory 100. In a particular implementation, a memory device may comprise a memory array to store signals representing information across one or more multilevel memory cells, and a controller to apply a soft decision and convolutional encoding to the memory array to determine a value of the information. Such a system may further comprise a memory device controller to operate the memory device, and a processor to host one or more applications and to initiate write and/or read commands to the memory device controller to provide access to the memory array. Of course, such details of a memory device are merely examples, and claimed subject matter is not so limited.

Figure 2A:
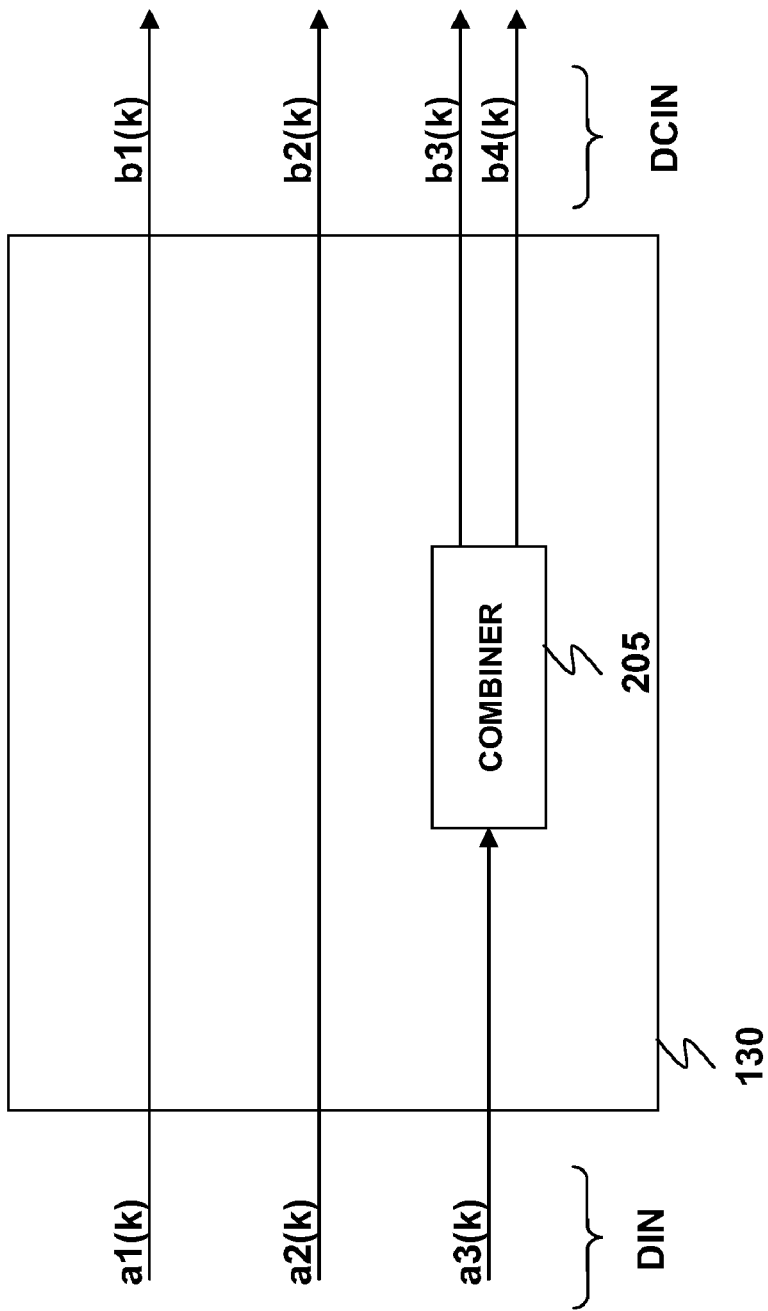
FIG. 2A is a block diagram of an encoding unit, according to an embodiment.

FIG. 2A is a block diagram of encoding unit 130, according to an embodiment. In a particular example, memory cells 110 may be programmed to store three bits of information each. Of course, other numbers of bits may be stored in other implementations. Herein, examples may describe particular implementations involving particular numbers, values, and so on. However, such particularities are intended merely for illustrative purposes, and claimed subject matter is not so limited. Input signal DIN to be stored in an addressed memory cell 110 may be represented by a string of three bits $a1(k)$, $a2(k)$, $a3(k)$, where "k" is an index comprising an integer. At each $k^{th}$ cycle of operation of memory 100, which may be defined by a clock signal (FIG. 5B) for example, a new string of bits $a1(k)$, $a2(k)$, $a3(k)$ may be provided to encoding unit 130 to be encoded. The number of memory cells 110 to be programmed during a particular memory access, e.g., during a particular $k^{th}$ cycle of operation, may be greater than one. However, for the sake of the simplicity, the presently described implementation involves a single memory cell 110 that may be accessed in one cycle of operation.

Encoding unit 130 may encode input signal DIN, comprising a three-bit string to obtain input encoded signal DCIN. According to an embodiment, encoding unit 130 may comprise a convolutional encoder that utilizes a linear encoding process to add redundancy to input signal DIN. In one implementation, such a linear encoding process may comprise a Viterbi process, though claimed subject matter is not so limited. Redundancy introduced by encoding unit 130 may involve one bit so that each three-bit string $a1(k)$, $a2(k)$, $a3(k)$ that forms input signal DIN may be encoded into a corresponding four-bit symbol $b1(k)$, $b2(k)$, $b3(k)$, $b4(k)$ forming the input encoded signal DCIN. Such a four-bit symbol $b1(k)$, $b2(k)$, $b3(k)$, $b4(k)$ may then be provided to read-program unit 115 to be stored in memory cell 110 addressed by address code ADR, for example. As will be described in greater detail below, each memory cell 110 may be programmed into $2^4=16$ different states, for example. Again, such examples are intended merely for illustrative purposes, and claimed subject matter is not so limited. Encoding unit 130 may include a linear combiner unit 205 comprising, for example, a finite state machine to generate bits $b3(k)$ and $b4(k)$ from bit $a3(k)$. On the other hand, bit $b1(k)$ may coincide with bit $a1(k)$ and bit b2(k) may coincide with bit a2(k). At each $k^{th}$ k cycle of operation, bits b3(k) and b4(k) may be calculated based, at least in part, on a signal (e.g., bit a3(k)) provided to linear combiner unit 205 during a particular cycle of operation and based, at least in part, on internal states of linear combiner unit 205 (being a finite state machine), which in turn may depend on values assumed by information provided to linear combiner unit 205 during preceding cycles of operation (herein indicated by the notation $(k-1)^{th}$), for example. Of course, such details of an encoding unit are merely examples, and claimed subject matter is not so limited.

Figure 2B:
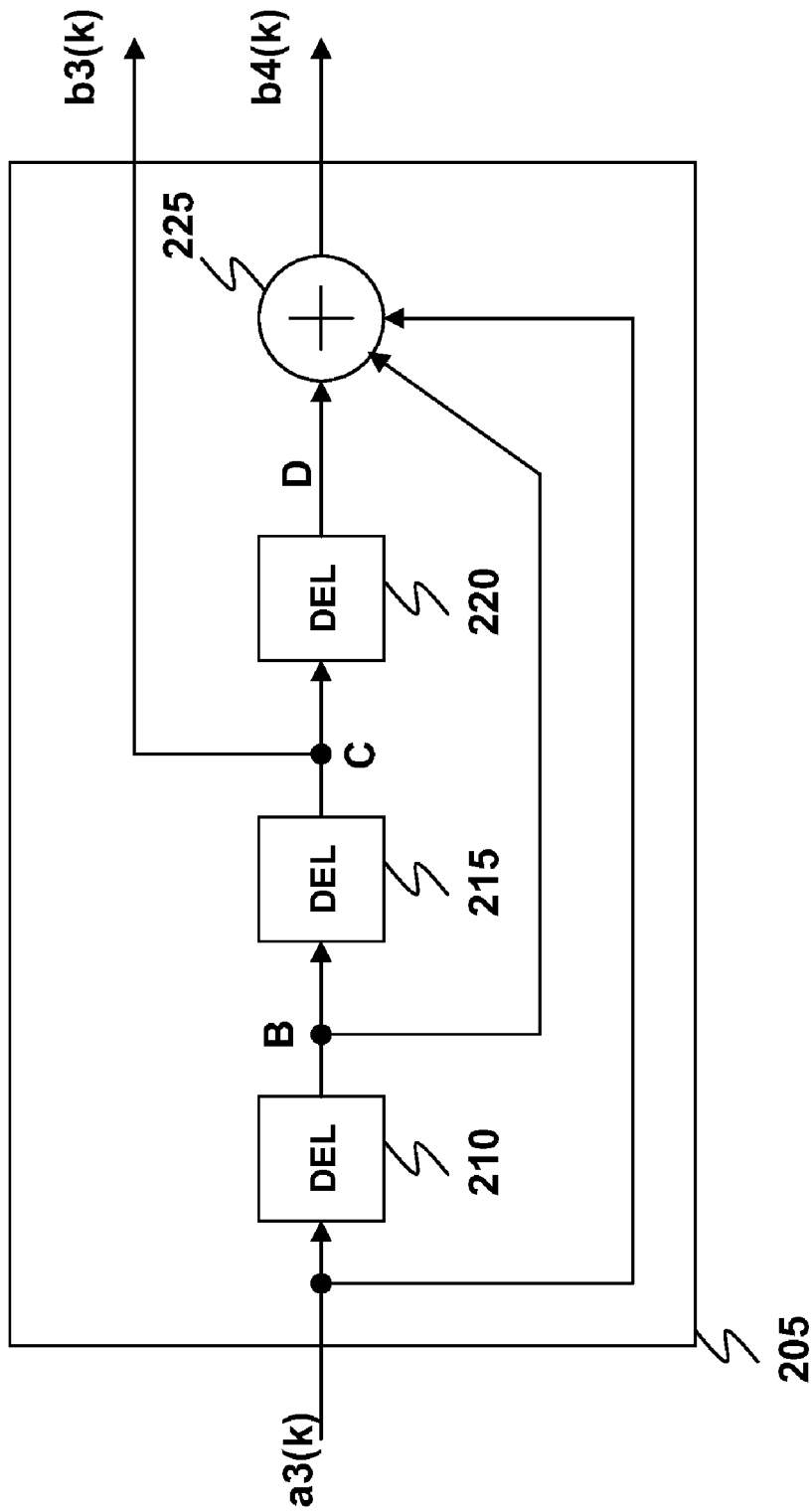
FIG. 2B is a block diagram of a linear combiner unit, according to an embodiment.

FIG. 2B is a block diagram of linear combiner 205, according to an embodiment. Linear combiner 205 may include three delay elements 210, 215, 220, and/or a binary adder 225. Each such delay element may receive a bit and memorize the value of the bit during a cycle of operation of memory 100. In this way, at each $k^{th}$ cycle of operation of memory 100, delay elements may provide an output signal representing a value received at the previous $(k-1)^{th}$ cycle of operation. For example, delay element 210 may receive and store bit a3(k). Delay element 210 may include an output terminal connected to an input terminal of delay element 215 (circuit node B). Delay element 215 may include an output terminal connected to an input terminal of delay element 220 (circuit node C), which in turn may have an output terminal connected to a first input terminal of binary adder 225 (circuit node D). Binary adder 225 may include a second input terminal connected to node B and a third input terminal to receive bit a3(k). Linear combiner 205 may include a first output terminal connected to node C for providing bit b3(k) and a second output terminal connected to an output terminal of binary adder 225 for providing bit b4(k). Of course, such details of a linear combiner are merely examples, and claimed subject matter is not so limited.

Figure 2C:
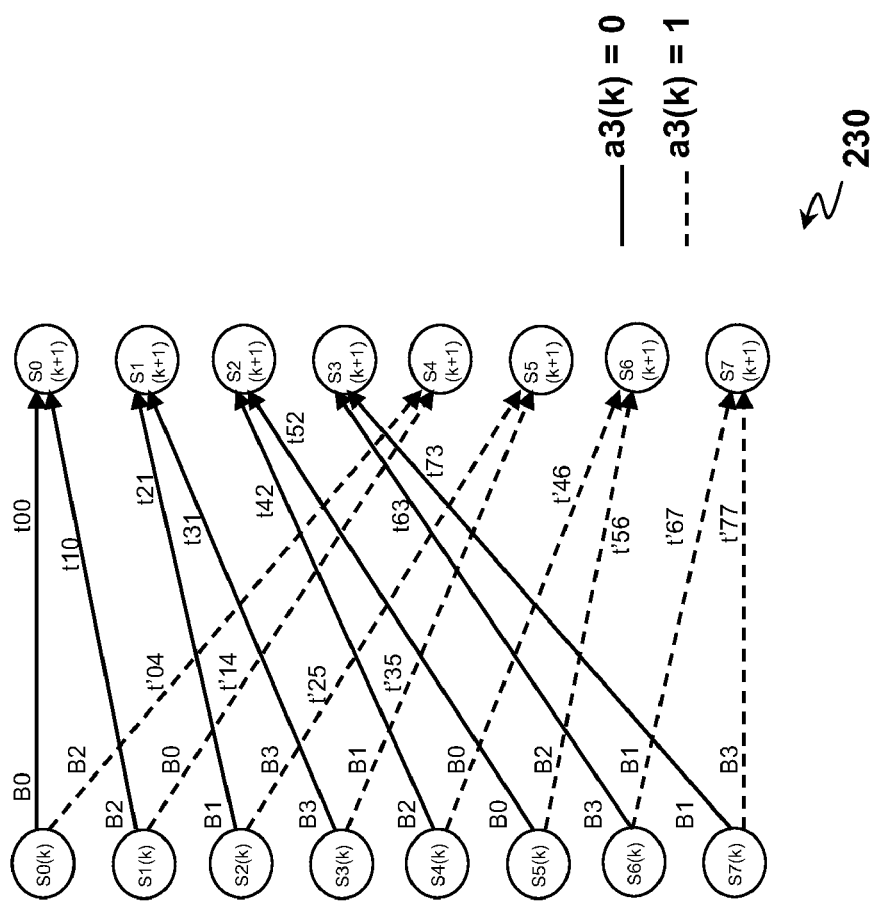
FIG. 2C is a trellis diagram for a linear combiner, according to an embodiment.

In an implementation, an encoding operation performed by encoding unit 130 may involve a particular ECC, which may be defined by linear combiner 205. FIG. 2C shows a trellis diagram 230, which may represent a code structure resulting from linear combiner 205, according to an embodiment. In particular, trellis diagram 230 may depict an evolving internal state of linear combiner 205 depending, at least in part, on the value of bit a3(k) received at its input.

The set of internal states of linear combiner 205 may be defined by values assumed by circuit nodes B, C, D, and thus may include $2^3=8$ different internal states, for example. In trellis diagram 230, the internal states may be identified with the references $S_i(k)$, $S_i(k+1)$, wherein i=0, 1, . . . , 7. Particularly, the reference $S_i(k)$ may correspond to the internal state assumed by linear combiner 205 at a generic $k^{th}$ cycle of operation of memory 100, while the reference $S_i(k+1)$ may correspond to the internal state assumed at the subsequent $(k+1)^{th}$ cycle of operation. Such a trellis diagram, of course, is merely an example, and claimed subject matter is not limited in this respect.

The trellis diagram 230 shows allowable transitions occurring between "present" internal states $S_i(k)$ and "future" internal states $S_i(k+1)$ of linear combiner 205 based, at least in part, on the value of bit a3(k). More particularly, a present internal state $S_i(k)$ may transition to two different future internal states $S_j(k+1)$ or $S_l(k+1)$. For example, if bit a3(k) is equal to "0", trellis diagram 230 shows that the internal state $S_i(k)$ may transition to a corresponding internal state $S_j(k+1)$ via a transition arrow $t_{ij}$ (depicted with a solid line). On the other hand, if bit a3(k) is equal to "1", the internal state $S_i(k)$ may transition to a corresponding internal state $S_l(k+1)$ via a further transition arrow $t'_{il}$ (depicted with a dashed line). The allowable transitions (e.g., indicated by transition arrows $t_{ij}$, $t'_{il}$) may define a code structure. Allowable transitions may in turn be defined by the structure of linear combiner 205. If the structure of linear combiner 205 is changed, by modifying a connection between a delay element and/or a binary adder, for example, allowable transitions in the trellis diagram 230, and/or corresponding code structure, may be accordingly changed.

Figure 3:
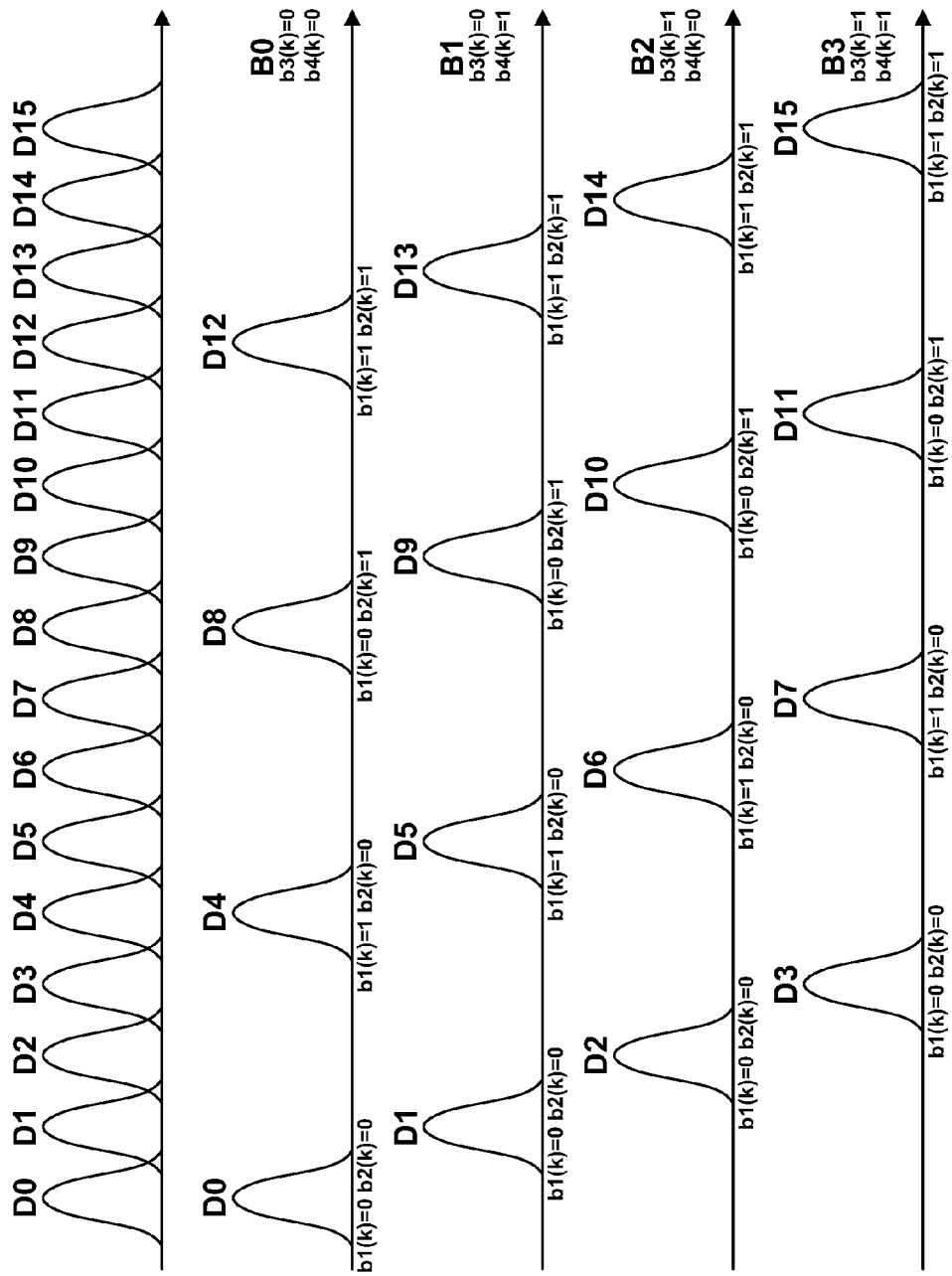
FIG. 3 is a diagram showing program distributions and partitions of such distributions, according to an embodiment.

In order to store the four-bit symbol b1(k), b2(k), b3(k), b4(k) generated by encoding unit 130 using a code defined by trellis diagram 230, an addressed memory cell 110 may be programmed into a corresponding one among sixteen different states, corresponding to respective sixteen program distributions D0, D1, . . . D15. The sixteen program distributions D0, D1, . . . D15, which may be based, at least in part, on the value assumed by the bits b1(k), b2(k), b3(k), b4(k), are illustrated in FIG. 3. Such program distributions D0, D1, . . . D15 may overlap one another because of their respective widths, and may depend, at least in part, on tolerances intrinsic to memory 100. In this respect, program distributions D0, D1, . . . D15 may not be drawn to scale in FIG. 3.

According to an embodiment, an association between bits b1(k), b2(k), b3(k), b4(k) and various program distributions D0, D1, . . . D15 may involve subset partitioning, as follows. For example, sixteen program distributions D0, D1, . . . D15 may be partitioned into four different subsets B0, B1, B2, B3, each one including four program distributions. The subsets may be identified by corresponding values of the bits b3(k), b4(k). For example, the subset B0 may correspond to b3(k)=0, b4(k)=0 and may include the program distributions D0, D4, D8, D12; the subset B1 may correspond to b3(k)=0, b4(k)=1 and may include the program distributions D1, D5, D9, D13; the subset B2 may correspond to b3(k)=1, b4(k)=0 and may include the program distributions D2, D6, D10, D14; the subset B3 may correspond to b3(k)=1, b4(k)=1 and may include the program distributions D3, D7, D11, D15.

Within a subset B0, B1, B2, B3, four program distributions may be discriminated based, at least in part, on the bits b1(k), b2(k). For example, first program distributions of subsets D0, D1, D2, D3 may correspond to b1(k)=0, b2(k)=0, the second distributions D4, D5, D6, D7 may correspond to b1(k)=1, b2(k)=0, the third distributions D8, D9, D10, D11 may correspond to b1(k)=0, b2(k)=1, and the fourth distributions D12, D13, D14, D15 may correspond to b1(k)=1, b2(k)=1. Moreover, within a subset B0, B1, B2, B3, a distance between adjacent program distributions may be increased in such a way as to avoid overlap between program distributions of the same subset.

Having established association linking bits b3(k) and b4(k) with four subsets B0, B1, B2, B3, and examining transitions of the internal states $S_i(k)$ of linear combiner 205 using the trellis diagram 230 of FIG. 2C, it may be possible to determine for a particular transition which subset is selected. For example, if linear combiner 205 is in the state $S_0(k)$, and if the value of the bit a3(k) received at the $k^{th}$ cycle of operation is equal to "0", then the internal state may transition to $S_0(k+1)$, and bits b3(k), b4(k) may assume the values "0", "0", respectively. An internal state may transition through transition arrow t00, for example. Such a pair of values may correspond to subset B0. If instead the value of the bit a3(k) is equal to "1", a selected subset may comprise B2, since the internal state may transition, through the transition arrow t'01, to $S_4(k+1)$, and bits b3(k), b4(k) may assume the values "1", "0", respectively. Of course, such details of a memory device are merely examples, and claimed subject matter is not so limited.

Figure 4:
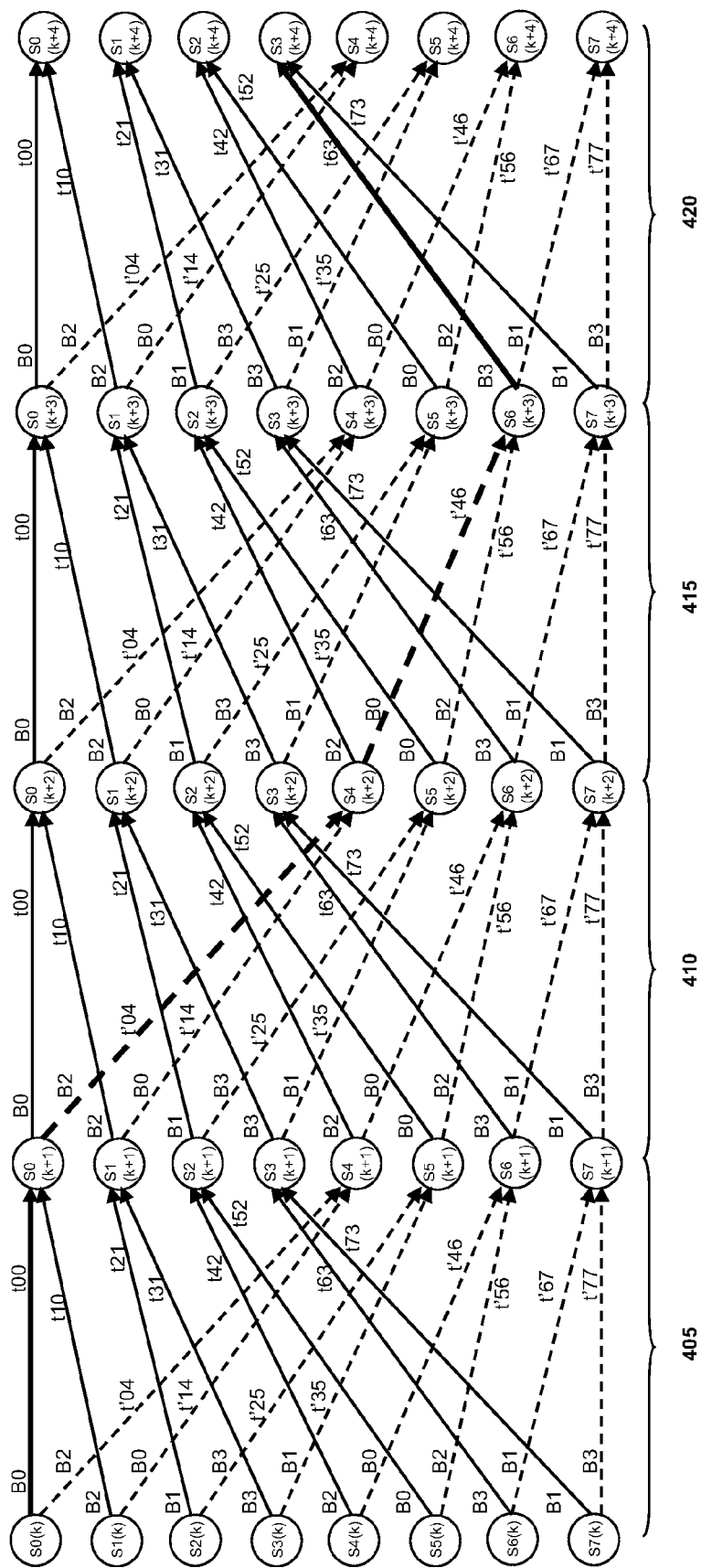
FIG. 4 is a trellis diagram, according to another embodiment.

FIG. 4 is a trellis diagram, according to another embodiment. In a particular example, a sequence of twelve bits of information may be stored in four memory cells 110. Such a sequence may comprise four portions of input signal DIN received during four consecutive cycles of operations. Particularly, at cycle "k", input signal DIN may correspond to string a1($k$)=0, a2($k$)=1, a3($k$)=0; at cycle "k+1", input signal DIN may correspond to string a1($k$+1)=0, a2($k$+1)=1, a3($k$+1)=1; at cycle "k+2", input signal DIN may correspond to string a1($k$+2)=1, a2($k$+2)=0, a3($k$+2)=1; and at cycle "k+3", input signal DIN may correspond to string a1($k$+3)=0, a2($k$+3)=0, a3($k$+3)=0. The initial internal state of linear combiner 205 may be $S_0(k)$. Of course, such a trellis diagram is merely an example, and claimed subject matter is not so limited.

At the $k^{th}$ cycle of operation, string a1($k$)=0, a2($k$)=1, a3($k$)=0 may be provided to encoding unit 130. As can be shown by the corresponding trellis diagram 405, at the following $(k+1)^{th}$ cycle of operation linear combiner 205 may maintain the same internal state $S_0(k+1)$ following transition arrow t00. The corresponding four-bit symbol generated by the encoding unit 130 to be stored in the first memory cell 110 may be b1($k$)=0, b2($k$)=1, b3($k$)=0, b4($k$)=0, which may correspond to the distribution D8 belonging to the subset B0, for example.

At the $(k+1)^{th}$ cycle of operation, string a1($k$+1)=0, a2($k$+1)=1, a3($k$+1)=1 may be provided to encoding unit 130. As can be shown by the corresponding trellis diagram 410, linear combiner 205 may switch to the internal state $S_4(k+2)$ via transition arrow t'01. Thus, the corresponding four-bit symbol generated by encoding unit 130 to be stored in the second memory cell 110 may be b1($k$+1)=0, b2($k$+1)=1, b3($k$+1)=1, b4($k$+1)=0, corresponding to the distribution D10 belonging to the subset B2.

At the $(k+2)^{th}$ cycle of operation, if the string a1($k$+2)=1, a2($k$+2)=0, a3($k$+2)=1 is provided to encoding unit 130, combiner unit 205 may switch from internal state $S_4(k+2)$ to internal state $S_6(k+3)$ via transition arrow t'46 (see trellis diagram 415). Consequently, the corresponding four-bit symbol generated by encoding unit 130 to be stored in the third memory cell 110 may be b1($k$+2)=1, b2($k$+2)=0, b3($k$+2)=0, b4($k$+2)=0, which may correspond to the distribution D4 belonging to the subset B0.

Finally, at the $(k+3)^{th}$ cycle of operation, if the string a1($k$+3)=0, a2($k$+3)=0, a3($k$+3)=0 is provided to encoding unit 130, the combiner unit 205 may switch from the internal state $S_6(k+3)$ to the internal state $S_3(k+4)$ via transition arrow t63 (see trellis diagram 420). Consequently, the corresponding four-bit symbol generated by encoding unit 130 to be stored in the fourth memory cell 110 may be b1($k$+3)=0, b2($k$+3)=0, b3($k$+3)=1, b4($k$+3)=1, which may correspond to the distribution D3 belonging to the subset B3.

Accordingly, encoding performed by encoding unit 130 may use a convolutional code so that each symbol may be generated by encoding unit 130 via an encoding path that may take into account the past history of the input signal DIN received at preceding cycles of operations. For example, referring to the previous example, the sequence of input signal DIN may have been encoded according to the encoding path $S_0(k)$-$S_0(k+1)$-$S_4(k+2)$-$S_6(k+3)$-$S_3(k+4)$. Four-bit symbol b1($k$+3), b2($k$+3), b3($k$+3), b4($k$+3) may have been calculated starting from internal state $S_6(k+3)$, which in turn may have been reached after three cycles of operations starting from internal state $S_0(k)$. If, for example, the sequence of input signal DIN received during the three preceding cycles of operations were different, the encoding path may be different, and, consequently, the internal state of combiner unit 205 may also be different from $S_6(k+3)$.

In an embodiment, bits of information stored in a group of addressed memory cells 110 may be retrieved using a soft-decision system on the output encoded signal DCOUT (FIG. 1) sensed by the read-program unit 115. More particularly, the output encoded signal DCOUT provided by read-program unit 115 may comprise a digital sequence of numbers indicating threshold voltages of addressed memory cells 110, for example. To retrieve stored bits of information using a soft-decision system with a sufficient degree of reliability, e.g., with a low probability of error, values of the threshold voltage sensed by read-program unit 115 may have a relatively high resolution to result in relatively high accuracy.

Figure 5A:
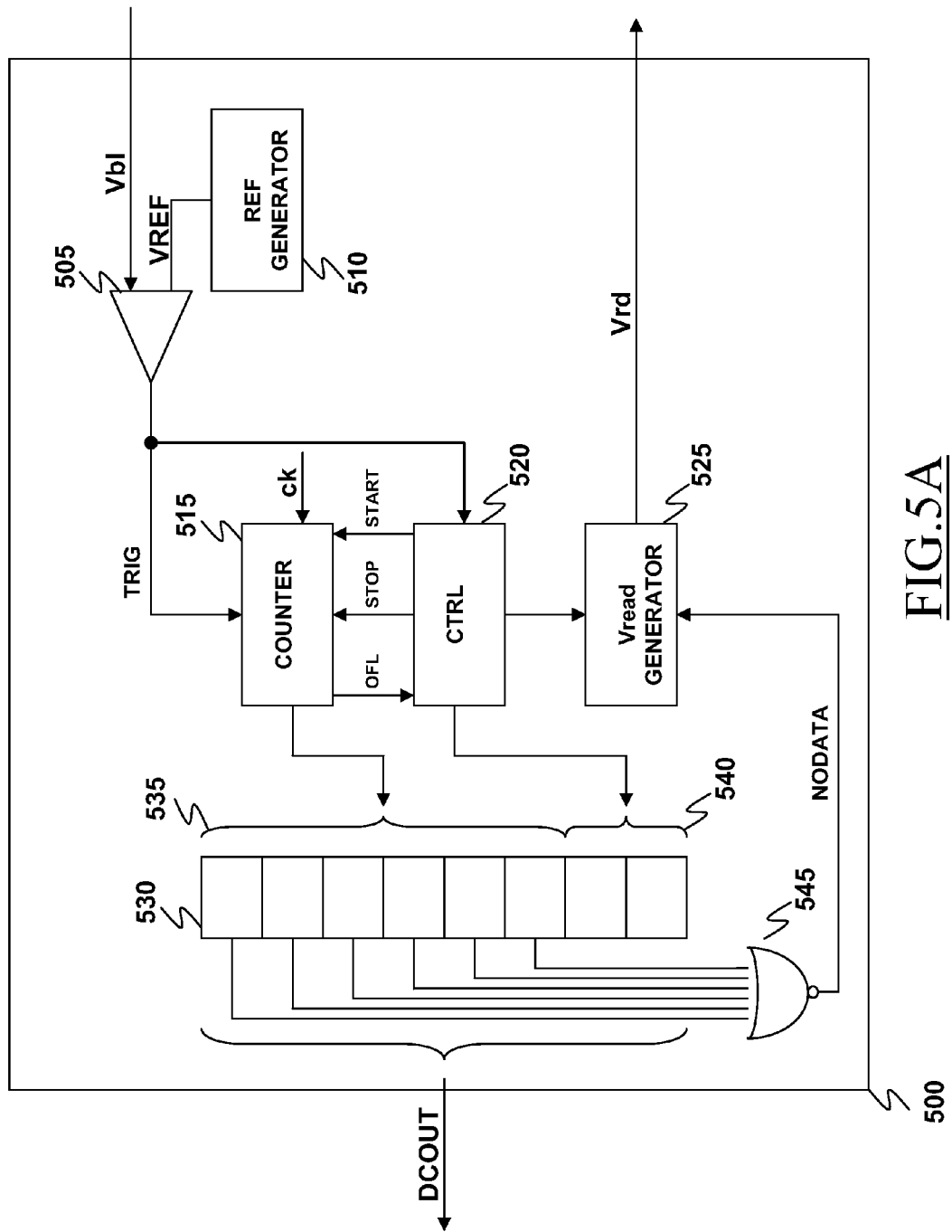
FIG. 5A is a schematic diagram of a sensing circuit, according to an embodiment.

For example, a threshold voltage of an addressed memory cell 110 may be sensed according to a voltage ramp reading scheme, wherein an increasing linear voltage ramp may be applied to a gate terminal of the addressed memory cell and a circuit may measure the time the memory cells takes to turn on. In one implementation, sensing a value of the threshold voltages of memory cells 110 may use a sensing circuit 500 shown in FIG. 5, for example. Sensing circuit 500 may comprise a portion of read-program unit 115. Sensing circuit 500 may include a voltage comparator 505 having a first input terminal for receiving a bit line voltage $V_{bl}$ indicative of the voltage of the bit line BL corresponding to an addressed memory cell 110. Voltage comparator 505 may also include a second input terminal coupled to a reference generator block 510 for receiving a reference voltage Vref, and an output terminal for providing a trigger signal TRIG to a counter circuit 515 if the value of the bit line voltage $V_{bl}$ goes below the reference voltage VREF. According to an embodiment, counter circuit 515 may generate a six-bit sequence, for example, starting from the value "000000" and ending to the value "111111", for example. Counter circuit 515 may receive a clock signal CK that defines the frequency with which the values of the sequence are updated. Operation of counter circuit 515 may be managed by a control block 520 through a reset signal RESET, a start signal START, and a stop signal STOP. Particularly, the sequence generated by counter circuit 515 may be started in response to assertional start signal START, is stopped in response to assertional stop signal STOP, and may be reset (for example, to the value "000000") in response to assertional reset signal RESET, for example. Furthermore, the trigger signal TRIG generated by voltage comparator 505 may also be provided to control block 520. Of course, such details of a sensing circuit are merely examples, and claimed subject matter is not so limited.

Control block 520 may also receive from counter circuit 515 an overflow signal OFL, which may be asserted if a sequence generated by counter circuit 515 has executed a complete cycle (e.g., reaching the value "111111"). Control block 520 may also be coupled to a reading voltage generator 525, which may generate a reading voltage $V_{rd}$ to be provided to the gate terminal of addressed memory cell 110. As will be described in greater detail below, reading voltage $V_{rd}$ may assume different values, depending on operations to be performed. Sensing circuit 500 may further include a register 530 to at least temporarily store 8 bits, for example. A first section 535 of register 530 may store 6 bits generated by counter circuit 515, and a second section 540 of register 530 may store a 2-bit string RN generated by control block 520, for example. A six-input NOR gate 545 may be coupled to register 530 in such a way as to receive at its input terminals the six bits stored in the first section 535. An output terminal of NOR gate 545 may be connected to control block 520 to provide a signal NO DATA to control block 520.

Figure 5B:
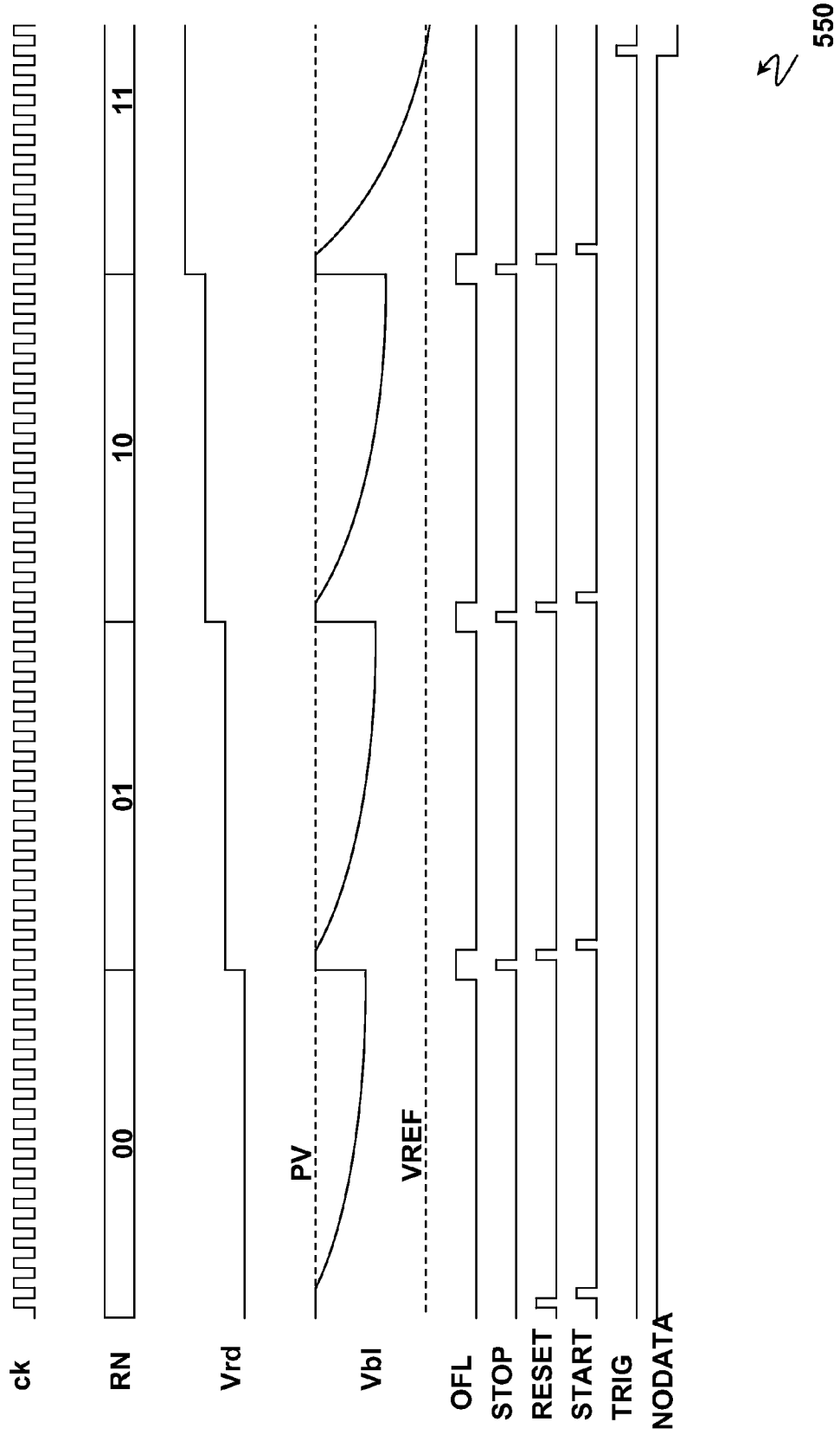
FIG. 5B is a timing diagram of a sensing circuit, according to an embodiment.

FIG. 5B is a timing diagram 550 of sensing circuit 500, according to an embodiment. Such a timing diagram 550 may illustrate a progression of signals involved during operations for sensing the threshold voltage of an addressed memory cell 110, for example. Sensing operations performed by sensing circuit 500 may provide for the execution of up to four or more distinct phases, each phase identified by a corresponding value of the string RN. At the beginning of a first phase (RN=00), control block 520 may assert the reset signal RESET in order to reset counter circuit 515, and register 530 may store in the first section 535 the string "000000". This means that the signal NO DATA may be set to a high value, for example. Concurrently, the voltage of the bit line BL connected to the memory string including the addressed memory cell 110 may be brought to a specific precharge voltage PV by using a precharging circuit (not shown). At this point, the reading voltage Vrd generated by the reading voltage generator 525 may be set to a first value, and the start signal START may be asserted by control block 520 in such a way as to start the sequence counted by counter circuit 515.

With the gate terminal of the addressed memory cell 110 that is biased to the reading voltage Vrd, the bit line BL may start to discharge with a discharging rate that depends, at least in part, on the threshold voltage of the memory cell 110. More particularly, if the memory cell 110 has been programmed to a program distribution corresponding to relatively high threshold voltages, the value of the reading voltage Vrd may not be sufficient to turn on the addressed memory cell 110. In such a case, the discharging rate may be particularly low since the bit line BL may discharge because of a substantially unavoidable leakage effect due to the presence of reverse-biased junctions in the addressed memory cell 110. On the other hand, if the threshold voltage is sufficiently low, the reading voltage $V_{rd}$ may be sufficient to turn on (at least partially) the memory cell 110, with a corresponding increase of the discharging rate, for example.

Counter circuit 515 may measure the time the bit line BL spends to discharge. Such measurement may indicate the threshold voltage of memory cell 110. More particularly, if the bit line voltage $V_{bl}$ goes below the reference voltage VREF, the voltage comparator 505 may assert the trigger signal TRIG, for example. In response to the assertion of the trigger signal TRIG, the control block 520 may assert the stop signal STOP to halt the sequence generated by the counter circuit 515. The value assumed by the sequence may then be temporarily stored in the first section 535 of the register 530. The value stored in the register 530 may provide an opportunity to quantify in a relatively precise way the threshold voltage of the addressed memory cell 110. If the value is different from "000000", the signal NO DATA generated by the NOR gate 545 may switch to a logic low value, signaling that the threshold voltage has been correctly sensed.

If the discharging rate of the bit line BL is too low, the sequence generated by the counter circuit 515 may reach the value "111111" before the bit line voltage $V_{bl}$ has reached the reference voltage VREF, for example. In this case, the counter circuit 515 may assert overflow signal OFL and control block 520 may assert stop signal STOP to halt counter circuit 115. At this point, a second phase (RN=01) may be initiated, with control block 520 asserting again the reset signal RESET for resetting counter circuit 515 and bit line BL that is returned to precharge voltage PV. Sensing circuit 500 may again perform operations previously described, though with an increased value for reading voltage $V_{rd}$. Again, if the discharging rate of the bit line BL is too low, a third (RN=10) or even a fourth phase (RN=11) may be performed, using subsequently increased reading voltages $V_{rd}$, for example. Therefore, the result of sensing operations performed by sensing circuit 500 may comprise a digital string. In a particular implementation, such a string may comprise an eight-bit digital string stored in a register 530, a value of which may represent the threshold voltage of the addressed memory cell 110. Of course, such a string and other details illustrated above are merely examples, and claimed subject matter is not so limited.

In the example illustrated in FIG. 5B, the bit line voltage $V_{bl}$ may drop below reference voltage VREF only during the fourth phase, thus indicating a high threshold voltage that may correspond to a relatively high program distribution. Such a value as that stored in register 530, for example, may not be sufficient to determine to which program distribution the memory cell 110 has been programmed. As described above with reference to FIG. 3, the sixteen program distributions D0, D1, ... D15 may overlap one another, and thus a specific threshold voltage value sensed using sensing circuit 500 may belong to one among two different adjacent program distributions. For this purpose, more operations may be performed, as will be described below.

If the threshold voltage has been correctly sensed, an 8-bit digital string stored in register 530 may represent the output encoded signal DCOUT to be provided to decoding unit 160. A memory cell 110 may have been programmed to a specific program distribution according to a code defined by encoding unit 130, and thus the information given by said 8-bit digital string (e.g., the value of the sensed threshold voltage) may be decoded to obtain the (decoded) output signal DOUT. Sensing circuit 500, as described above, may sense the threshold voltage value of the addressed memory cell 110 with a resolution of, for example, 8 bits using a four-step procedure. More particularly, sensing circuit 500 may carry out four distinct readings, identified by the 2-bit string RN, with a resolution of 6 bits each, though claimed subject matter is not limited in this respect. Each of the four readings may occur after the bit line BL is brought again to precharge voltage PV.

An alternative approach to sense a threshold voltage that need not involve more than one bit line precharging per memory cell 110 may include a single reading operation substantially similar to one of the four reading operations previously described, but with an improved resolution, such as an 8-bit resolution, for example. However, in this case, sensing may be disturbed by a leakage effect of a memory cell since such a single reading operation may involve a longer time to be performed, and, consequently, a discharging rate of bit line BL may be mainly due to such a leakage effect.

Figure 6:
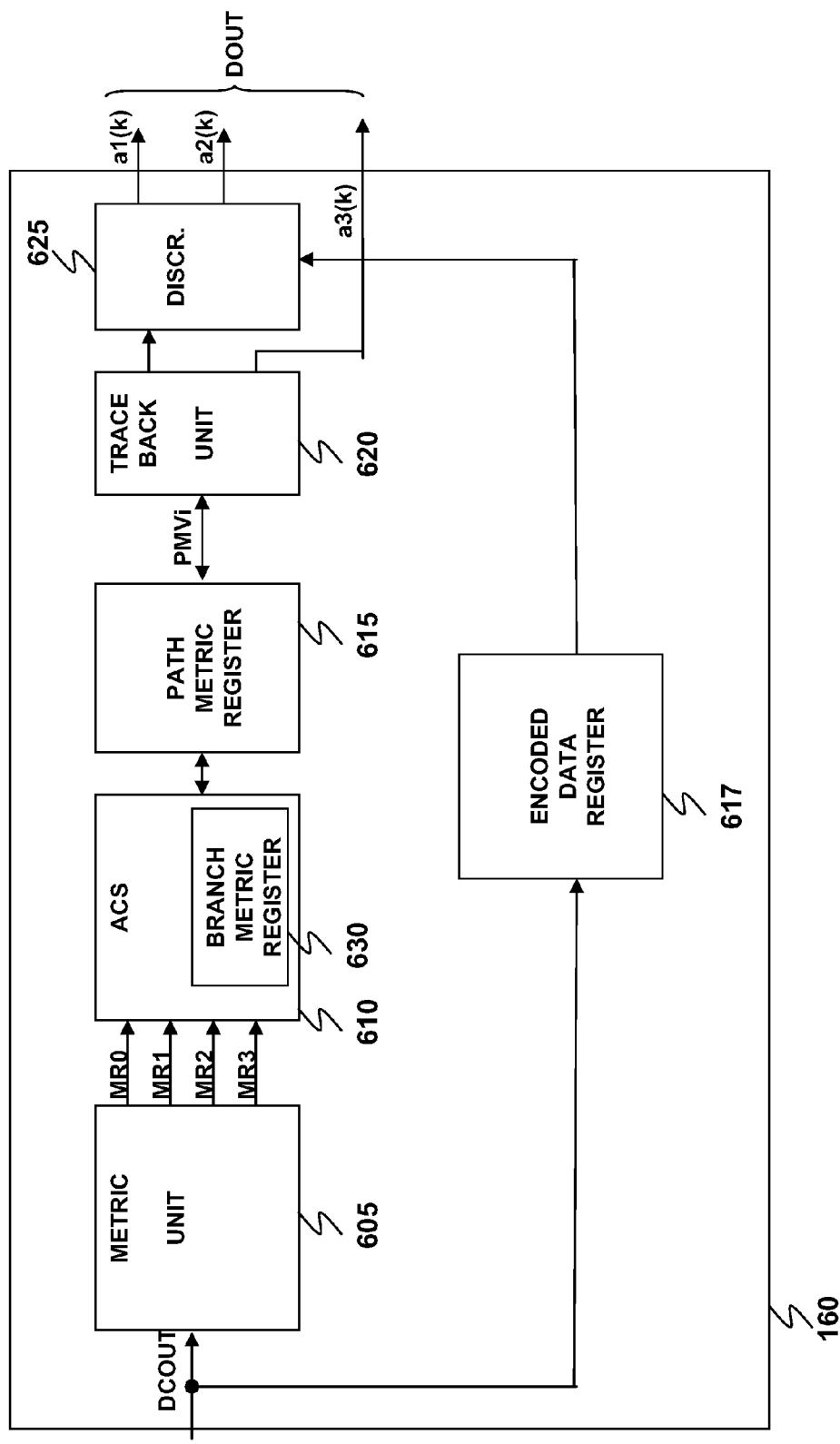
FIG. 6 is a schematic block diagram of a decoding unit, according to an embodiment.

FIG. 6 is a schematic block diagram of decoding unit 160, according to an embodiment. As previously mentioned, decoding unit 160 may perform decoding operations on the output encoded signal DCOUT to obtain the corresponding (decoded) output signal DOUT. Decoding unit 160 may include a metric unit 605 to receive the output encoded signal DCOUT indicating the value of the sensed threshold voltage, for example. Decoding unit 160 may accordingly generate four corresponding metric values MR0, MR1, MR2, MR3, which may quantify the probability that the sensed threshold voltage belongs to a program distribution belonging to the subsets B0, B1, B2, B3, respectively. For values of a threshold voltage that memory cell 110 may assume, (e.g., for values of the output encoded signal DCOUT) metric unit 605 may calculate metric values MR0, MR1, MR2, MR3 based, at least in part, on a definition of the subset partitioning of the program distributions D0, D1, ..., D15, for example. Of course, such details of a decoding unit are merely examples, and claimed subject matter is not so limited.

Figure 7A:
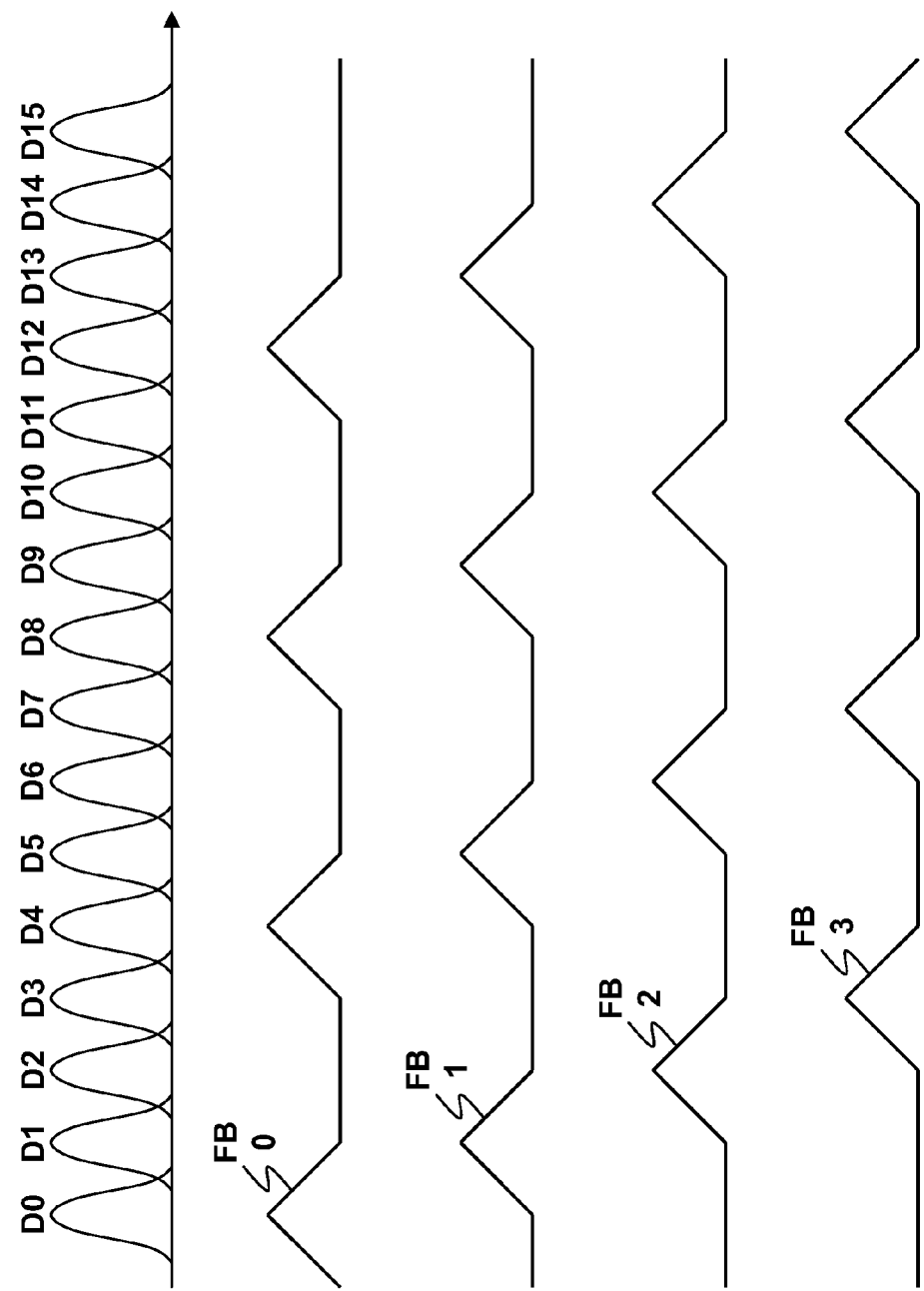
FIG. 7A is a diagram showing program distributions and metric functions of such distributions, according to an embodiment.

According to an embodiment, in order to describe how various metric values MR0, MR1, MR2, MR3 may be calculated by the metric unit 605, reference will be now made to FIG. 7A in conjunction with FIG. 3 (which illustrates how program distributions D0, D1, ..., D15 may have been partitioned into subsets B0, B1, B2, B3). FIG. 7A shows for each subset Bi (i=0, 1, 2, 3) a corresponding metric function FBi, whose trend may be correlated with the probability that the threshold voltage corresponds to the subset Bi. The trend of FBi may depend, at least in part, on the threshold voltage of a memory cell 110, for example. Metric functions FBi may be established taking into account, for example, the number of program distributions and the way the program distributions are arranged in subsets. According to an embodiment, metric function FBi illustrated in FIG. 7A may comprise a periodic function presenting maximum values corresponding to central peaks of each program distribution belonging to subset Bi. Such a periodic function may decrease as the threshold voltage value departs from the value corresponding to the peaks. For example, the metric function FB0 may present the maximum value for the four threshold voltage values that correspond to the central peaks of distributions D0, D4, D8, and D12. Thus, the four threshold voltage values may be those having the highest probability of belonging to subset B0, because these values may correspond to the center of the program distributions D0, D4, D8, D12 forming the subset B0 itself. Moreover, metric function FB0 may be equal to zero for those threshold voltage values that are at the largest distances from centers of program distributions D0, D4, D8, D12. For example, a threshold voltage value that corresponds to a peak of the distribution D2 may be positioned at the largest distance from peaks of the nearest program distributions belonging to subset B0 (e.g., D0 and D4), and thus has a probability of belonging to a program distribution included in the subset B0 that is close to zero.

According to an embodiment, metric functions FB0, FB1, FB2, FB3 may be implemented using a look-up table such as look-up table 710 shown in FIG. 7B. More particularly, if the output encoded signal DCOUT has been generated using sensing circuit 500 (e.g., with a resolution of eight bits as being merely an example), the look-up table 710 may includes $2^8=256$ rows, each row corresponding to a respective value of the threshold voltage. Each row of the look-up table 710 may include four metric values MR0, MR1, MR2, MR3 related to the threshold voltage value that corresponds to the row. For example, according to a particular implementation, four metric values MR0, MR1, MR2, MR3 may be represented by four corresponding 6-bit digital strings. The values of the four 6-bit digital strings may be proportional to values assumed by metric functions FB0, FB1, FB2, FB3 at the threshold voltage included in that row of the look-up table 710. In look-up table 710, the threshold voltage value corresponding to a peak of distribution D0 may have been made to correspond to DCOUT="8". Consequently, the metric value MR0 included in the eighth row of look-up table 710 may be equal to "111111", indicating that the probability that the threshold voltage value belongs to the subset B0 (comprising the program distribution D0) is at the highest value. Look-up table 710 may be stored in a corresponding read-only memory (ROM), or in four different ROM's, each one dedicated to a respective one among metric values MR0, MR1, MR2, MR3, for example. Of course, such details as a number of bits of resolution are merely examples, and claimed subject matter is not so limited.

Figure 7C:
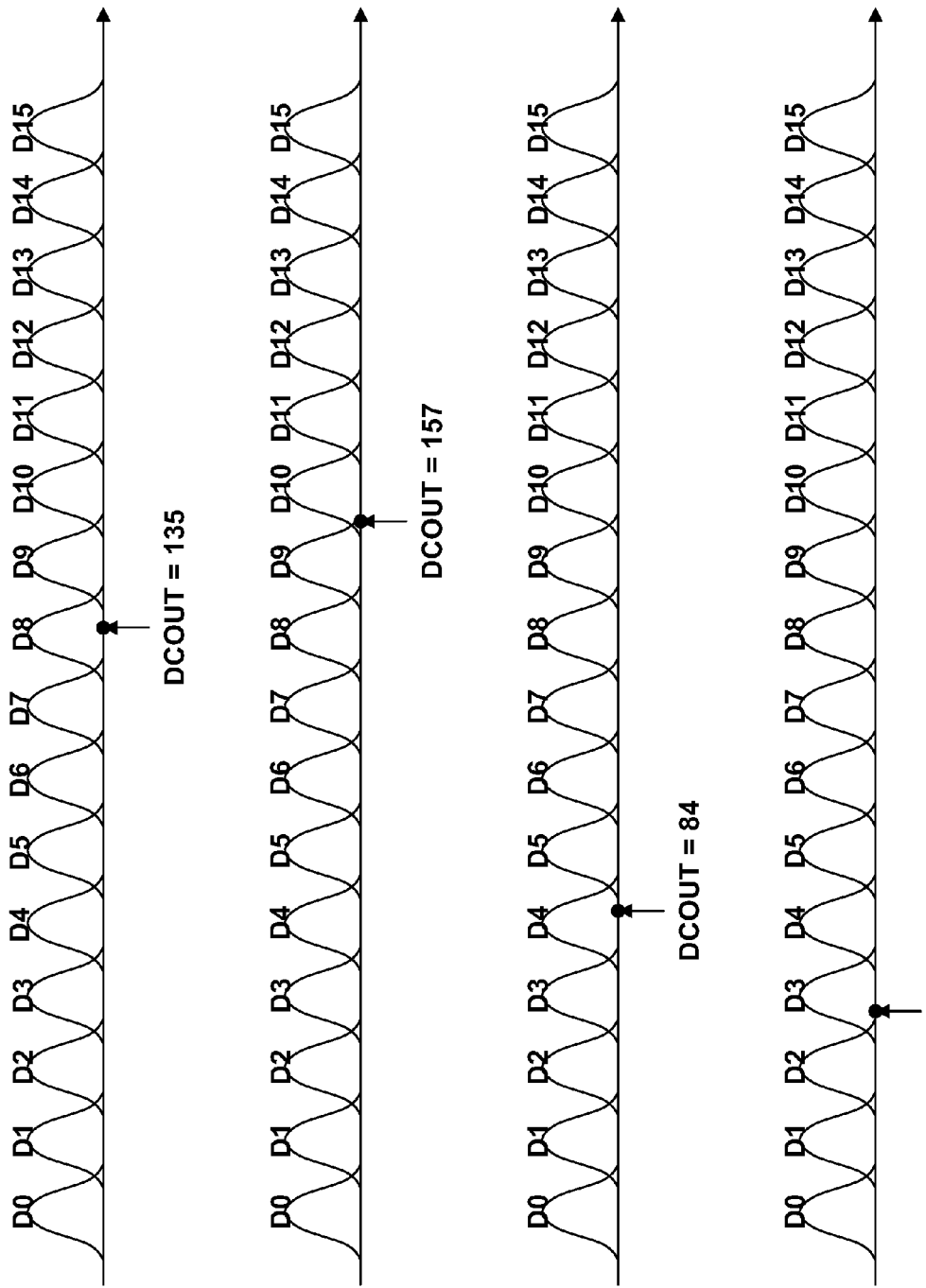
FIG. 7C is a diagram showing program distributions and metric values, according to an embodiment.

Reference will be now made to FIG. 7C, which depicts metric values MR0, MR1, MR2, MR3 generated by metric unit 605 in response to four particular output encoded signal DCOUT values generated by the read-program unit 115, according to an embodiment. The first value of DCOUT received may comprise the value "135". For example, the value may correspond to the threshold voltage value assumed by the first memory cell 110 that was programmed in the example illustrated in FIG. 4. Thus, DCOUT="135" may correspond to a threshold voltage positioned in the proximity of the central peak of the program distribution D8, which may belong to the subset B0. With this particular output encoded signal DCOUT value, the highest metric value may be MR0, which may equal "60" (for the sake of the clarity, metric values are represented herein in decimal).

The second value of DCOUT received may instead have the value "157". This value may for example correspond to the threshold voltage value assumed by the second memory cell 110 that has been programmed in the example illustrated in FIG. 4. Thus, DCOUT="157" may correspond to a threshold voltage positioned around a central value between program distribution D9, which may belong to the subset B1, and program distribution D10, which may belong to the subset B2. In fact, with such a particular DCOUT value, the highest metric value, which may be MR2="31", may be substantially equal to the metric value MR1="29".

The third received value of DCOUT may instead comprise the value "84". For example, the value may correspond to the threshold voltage value assumed by the third memory cell 110 that has been programmed in the example illustrated in FIG. 4. Thus, DCOUT="84" may correspond to a threshold voltage positioned substantially near the central peak of program distribution D4, which may belong to the subset B0, but slightly shifted toward program distribution D5, which may belong to the subset B1. As a consequence, the highest metric value, which may comprise MR0="40", may be considerably higher than the second highest metric value, which may comprise MR1="25".

Finally, the fourth value of DCOUT may have the value "61". This value may, for example, correspond to the threshold voltage value assumed by the fourth memory cell 110 that has been programmed in the example illustrated in FIG. 4. Thus, DCOUT="61" may correspond to a threshold voltage positioned near the central peak of program distribution D3, which may belong to the subset B3, and slightly shifted toward program distribution D2, which may belong to the subset B2. As a consequence, the highest metric value, which may comprise MR3="48", may be considerably higher than the second highest metric value, which may comprise MR2="20". Accordingly, it may be determined that the first memory cell has been programmed to a program distribution belonging to the subset B0. Similarly, the third memory cell may have been programmed to a program distribution belonging to the subset B0 while the fourth memory cell may have been programmed to a program distribution belonging to the subset B3. However, it may be relatively difficult to determine the subset to which the second memory cell may have been programmed, since both subsets B1 and B2 may have approximately the same probability.

In an embodiment, as explained in further detail below, decoding unit 160 may retrieve bits of information encoded by encoding unit 130, and then store such information in a group of n memory cells 110. For example, decoding unit 160 may retrieve bits of information by performing soft-decision decoding operations on metric values calculated according to DCOUT read from n memory cells 110. Returning to FIG. 6, metric unit 605 may be coupled to an Add-Compare-Select (ACS) unit 610, which may accumulate metric values MR0, MR1, MR2, MR3 of DCOUT read from n memory cells 110. In this fashion, a set of path metric values PMVi(k), wherein i=0 to 7 (e.g., the number of states $S_i(k)$), forming a trellis diagram defining code implemented by encoding unit 130) may be generated for each memory cell. Such path metric values may allow a determination of the most probable encoding path that has been followed for encoding the bits of information stored in n memory cells 110. The path metric values PMVi(k) corresponding to each of n memory cells 110 may be temporarily stored in a path metric register 615, for example.

Decoding unit 160 may further comprise an encoded information register 617 to temporarily store the DCOUT read from n memory cells 110 and a trace-back unit 620 coupled to path metric register 615 for receiving path metric values PMVi(k). Based at least in part on received path metric values PMVi(k), trace-back unit 620 may carry out soft-decision operations in order to retrieve, for each of n memory cells 110, a subset including a program distribution to which a particular memory cell 110 has been programmed. Trace-back unit 620 may be capable of retrieving a first portion of the output signal DOUT, which may comprise a portion of signal DIN that has been encoded via linear combiner unit 205 previously to be stored in a particular memory cell 110. Referring to the ECC defined by trellis code 230 shown in FIG. 2C, the portion of the signal DIN retrieved by trace-back unit 620 may include bit a3(k) of the 3-bit string a1(k), a2(k), a3(k). Bit a3(k) may be used to generate bits b3(k), b4(k) of DCIN.

In order to retrieve the remaining portion of signal DOUT corresponding to the portion of signal DIN that has not been encoded (e.g., the two bits a1(k), a2(k)), decoding unit 160 may further include a discriminator unit 625 coupled to trace back unit 620 and encoded information register 617. Particularly, as will be described below, a remaining portion of signal DOUT may be calculated based, at least in part, on a particular subset retrieved by trace back unit 620 and DCOUT.

To describe an example, decoding unit 160 may decode a sequence of output encoded signal DCOUT sensed from four memory cells 110 that have been programmed according to encoded signal DCIN provided in the example referenced to FIG. 4. Thus, first memory cell 110 may be programmed according to the string a1(k)=0, a2(k)=1, a3(k)=0; second memory cell 110 may be programmed according to the string a1(k+1)=0, a2(k+1)=1, a3(k+1)=1; third memory cell 110 may be programmed according to the string a1(k+2)=1, a2(k+2)=0, a3(k+2)=1; and fourth memory cell 110 may be programmed according to the string a1(k+3)=0, a2(k+3)=0, a3(k+3)=0. The description of the operations carried out by decoding unit 160 are described in reference to FIG. 8, which includes trellis diagrams 405, 410, 415, 420 corresponding to the four memory cells described above.

At a first $k^{th}$ cycle of operation, metric unit 605 may receive from sensing circuit 500 the first output encoded signal DCOUT corresponding to the threshold voltage of the first memory cell. In this case, the output encoded signal DCOUT may equal "135". As already described, metric unit 605 may calculate corresponding metric values MR0, MR1, MR2, MR3, which in this case may equal "60", "10", "2", and "12", respectively.

ACS unit 610 may generate path metric values PMVi(k) from metric values MR0, MR1, MR2, MR3 according to a process described as follows. As explained above, during encoding operations performed by encoder unit 130, transitions in a trellis diagram may be associated with a corresponding subset selection. Accordingly, ACS unit 610 may assign to each possible transition in trellis diagram 405 that occurs among states $S_i(k)$ and states $S_i(k+1)$ the metric value of the subset associated to that transition. For example, since the transition from state $S_0(k)$ to state $S_0(k+1)$, which may be identified by transition arrow t00, may be associated with the selection of the subset B0, ACS unit 610 may assign the metric value MR0 to the transition, which may equal "60" in this case. The transition from state $S_0(k)$ to state $S_4(k+1)$, identified by transition arrow t'04, may instead be associated with the selection of the subset B2. Thus, ACS unit 610 may assign the metric value MR2 to the transition, which may equal "2" in this case. Again, such a trellis diagram is merely an example, and claimed subject matter is not so limited.

In an embodiment, a process by which metric values may be assigned to various transitions of trellis diagram 405 may define a corresponding "branch metric set". For each state $S_i(k)$ of trellis diagram 405, two metric values, referred to as "branch metric values", may be assigned to the two transitions that branch from state $S_i(k)$ itself. Such branch metric values may be temporarily stored in a branch metric register 630, for example.

Then, for each state $S_i(k)$ of trellis diagram 405, ACS unit 610 may compare the two corresponding metric values, select the highest one, set the path metric value PMVi(k) to the selected metric value, and may store the selected metric value in path metric register 615. In this case, path metric values PMVi(k) generated during the $k^{th}$ cycle of operation, corresponding to the first memory cell, may comprise PMV0(k)="60", PMV1(k)="12", PMV2(k)="60", PMV3(k)="12", PMV4="60", PMV5(k)="12", PVM6(k)="60", and PVM7(k)="12".

During the following (k+1) cycle of operation, the metric unit 605 may receive from sensing circuit 500 the second output encoded signal DCOUT, which may correspond to the threshold voltage of the second memory cell. In this case, for example, DCOUT may equal "157", and corresponding metric values MR0, MR1, MR2, and MR3 may equal "8", "29", "31", and "11", respectively. As previously described, by using such new metric values, ACS unit 610 may generate a new branch metric set corresponding to trellis diagram 410, and may store the branch metric set in branch metric register 630.

In an embodiment, for each state $S_i(k+1)$ of trellis diagram 410, ACS unit 610 may compare two corresponding metric values, select the highest one, and set path metric value PMVi(k+1) to the sum of metric values between the selected metric value and the path metric value PMVi(k) calculated at the preceding $k^{th}$ cycle of operation already stored in path metric register 615. ACS unit 610 may store the path metric value in the path metric register 615. In this case, resulting path metric values PMVi(k+1), corresponding to the second memory cell, may comprise PMV0(k+1)="68", PMV1(k+1)="89", PMV2(k+1)="91", PMV3(k+1)="71", PMV4(k+1)="91", PMV5(k+1)="71", PVM6(k+1)="68", and PVM7(k+1)="89". Of course, such details of assigning metric values are merely examples, and claimed subject matter is not so limited. Path metric values PMVi(k+2) generated during the (k+2) cycle of operation, and corresponding to the third memory cell, may comprise PMV0(k+2)="108", PMV1(k+2)="116", PMV2(k+2)="111", PMV3(k+2)="111", PMV4(k+2)="129", PMV5(k+2)="99", PVM6(k+2)="131", and PVM7(k+2)="97". Further, the path metric values PMVi(k+3) generated during the (k+3) cycle of operation, and corresponding to the fourth memory cell, may comprise PMV0(k+3)="136", PMV1(k+3)="159", PMV2(k+3)="149", PMV3(k+3)="179", PMV4(k+3)="128", PMV5(k+3)="159", PVM6(k+3)="140", and PVM7(k+3)="145".

In an embodiment, path metric values PMVi(k), PMVi(k+1), PMVi(k+2), PMVi(k+3) may be generated by selecting, at each cycle of operation and for each state of the trellis diagrams, transitions having the highest metric values. Accordingly, it is now possible to retrieve the encoding path followed by encoding unit 130 for encoding a portion of signal DIN provided to linear combiner unit 205. Particularly, trace back unit 620 may access path metric register 615, scan path metric values PMVi(k+3) corresponding to the last memory cell 110 to be read, and may select the state $S_i(k+4)$ that has the highest path metric value PMVi(k+3), for example. Using a soft-decision selection, this state may be the most probable candidate to be the final state of the encoding path to be retrieved. In the present example, this state may comprise the state $S_3(k+4)$, which has a path metric PMVi(k+3) equal to "179".

At this point, in order to trace back the preceding state of the encoding path (in this case, the (k+3) state), trace back unit 620 may check transitions from states $S_i(k+3)$ to the selected state $S_i(k+4)$. In this case, such transitions may include the transition starting from the state $S_6(k+3)$ and the transition starting from the state $S_7(k+3)$. Trace back unit 620 may then select the transition that starts from the state $S_i(k+3)$ having the highest path metric value PMVi(k+2). The selected state may represent the second to the last state of the encoding path to be retrieved. In this example, the selected state may comprise the state $S_6(k+3)$, having a path metric value PMVi(k+2) equal to "131". Having determined the transition that connects the last two states of the encoding path, it may be possible to retrieve the subset to which the threshold voltage of the fourth memory cell 110 has been programmed, since each transition in the trellis diagram may be associated with the selection of a particular subset (in this case, the subset B3), for example.

As described earlier, each transition in a trellis diagram between a pair of states may also be associated with a corresponding value of the portion of signal DIN that has been encoded. In other words, having determined the transition that connects the last two states of the encoding path, it may be possible to retrieve the bit $a3(k+3)$ that has been stored in the fourth memory cell 110. In this example, the selected transition, which may start from the state $S_6(k+3)$ and end at the state $S_3(k+4)$ may correspond to $a3(k+3)$="0". At this point, the process may be reiterated for tracing back other preceding states of the encoding path by selecting those transitions having the highest path metric values.

Figure 8:
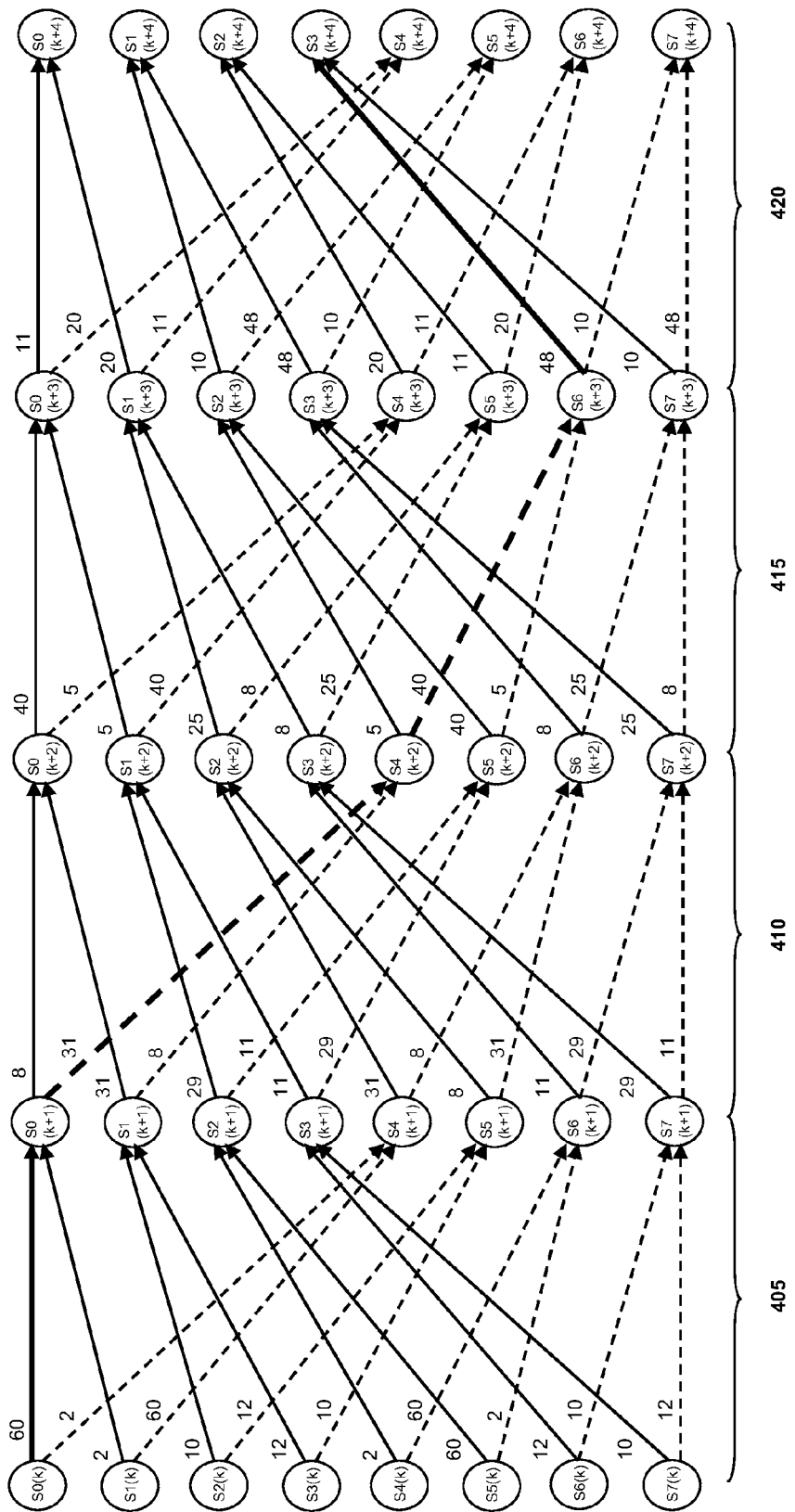
FIG. 8 is a trellis diagram, according to another embodiment.

With reference to FIG. 8, the encoding path retrieved with the process described above is depicted with a thicker line, and includes the state sequence (from the first to the last): $S_0(k)$-$S_0(k+1)$-$S_4(k+2)$-$S_6(k+3)$-$S_3(k+4)$. The encoding path may coincide with the path effectively followed by encoding unit 130 for encoding information bits to be stored in the four memory cells 110 of the example referencing FIG. 4. Accordingly, the sequence of bits produced by trace back unit 620 may be the correct one, e.g., $a3(k)$="0", $a3(k+1)$="1", $a3(k+2)$="1", and $a3(k+3)$="0". The remaining portion of signal DOUT corresponding to the portion of signal DIN that has not been encoded (e.g., the bits $a1(k)$, $a2(k)$, $a1(k+1)$, $a2(k+1)$, $a1(k+2)$, $a2(k+2)$, $a1(k+3)$, and $a2(k+3)$) may instead be retrieved by discriminator unit 625. Particularly, for each memory cell 110, discriminator unit 625 may be capable of retrieving the portion of signal DOUT based at least in part on the subset to which the threshold voltage of the memory cell 110 has been programmed, and based at least in part on DCOUT representing the threshold voltage of that memory cell 110. Threshold voltage may be determined by trace back unit 620. DCOUT may be stored in encoded information register 617.

In an embodiment, program distributions belonging to a subset may not overlap each other and each program distribution within a subset may be associated with a determined portion of signal DIN (e.g., the portion that has not been encoded). Accordingly, knowledge of a subset to which the threshold voltage of a memory cell 110 has been programmed and the value of the threshold voltage itself may be sufficient for identifying a specific program distribution to which the threshold voltage has been programmed, and the associated portion of signal DIN. For example, referring to the fourth memory cell 110 of the previous example, trace back unit 620 may determine that the subset to which its threshold voltage has been programmed is the subset B3. Referring to FIG. 3, subset B3 may include program distributions D3, D7, D11, and D15. The associated DCOUT may correspond to a threshold voltage positioned near the central peak of program distribution D3, which may belong to subset B3 and slightly shifted toward program distribution D2, which in turn may belong to the subset B2 (see FIG. 7C). Accordingly, knowledge that the subset to which its threshold voltage has been programmed comprises subset B3 may allow a way to determine whether the threshold voltage has been programmed to program distribution D3. For example, the first program distributions of each subset D0, D1, D2, D3 may be associated with $b1(k+3)$=0 and $b2(k+3)$=0, the second distributions D4, D5, D6, D7 may be associated with $b1(k+3)$=1 and $b2(k+3)$=0, the third distributions D8, D9, D10, D11 may be associated with $b1(k+3)$=0 and $b2(k+3)$=1, and the fourth distributions D12, D13, D14, D15 may be associated with $b1(k+3)$=1 and $b2(k+3)$=1. Since $b1(k+3)$=$a1(k+3)$, $b2(k+3)$=$a2(k+3)$, the remaining portion of signal DOUT corresponding to the fourth memory cell 100 may comprise $a1(k+3)$=0, $a2(k+3)$=0. By repeating such operations for the four memory cells 110 of the example, signal DOUT may be retrieved. For example, for the first memory cell 110, $a1(k)$=0, $a2(k)$=1, $a3(k)$=0; for the second memory cell 110, $a1(k+1)$=0, $a2(k+1)$=1, $a3(k+1)$=1; for the third memory cell 110 $a1(k+2)$=1, $a2(k+2)$=0, $a3(k+2)$=1; and for the fourth memory cell 110 $a1(k+3)$=0, $a2(k+3)$=0, $a3(k+3)$=0.

Operations performed by encoding-decoding unit 120 previously described may use a particular convolutional code defined by the structure of linear combiner 205 and a particular subset partitioning. However, similar considerations may apply in case the subset partitioning and the code used for encoding the information to be stored in the memory cells are different. For example, in the embodiments described above, for storing in each memory cell 110 three bits of information (such as the un-coded string formed by the bits $a1(k)$, $a2(k)$, $a3(k)$) each memory cell 110 may be programmed into a corresponding one among sixteen different states, corresponding to the sixteen program distributions D0, D1, . . . D15, depending on the value assumed by corresponding (encoded) string $b1(k)$, $b2(k)$, $b3(k)$, $b4(k)$. The number of program distributions may be defined by the number of bits forming the string $b1(k)$, $b2(k)$, $b3(k)$, $b4(k)$, which may be defined in turn by the redundancy introduced by the code used for generating the string.

Figure 9A:
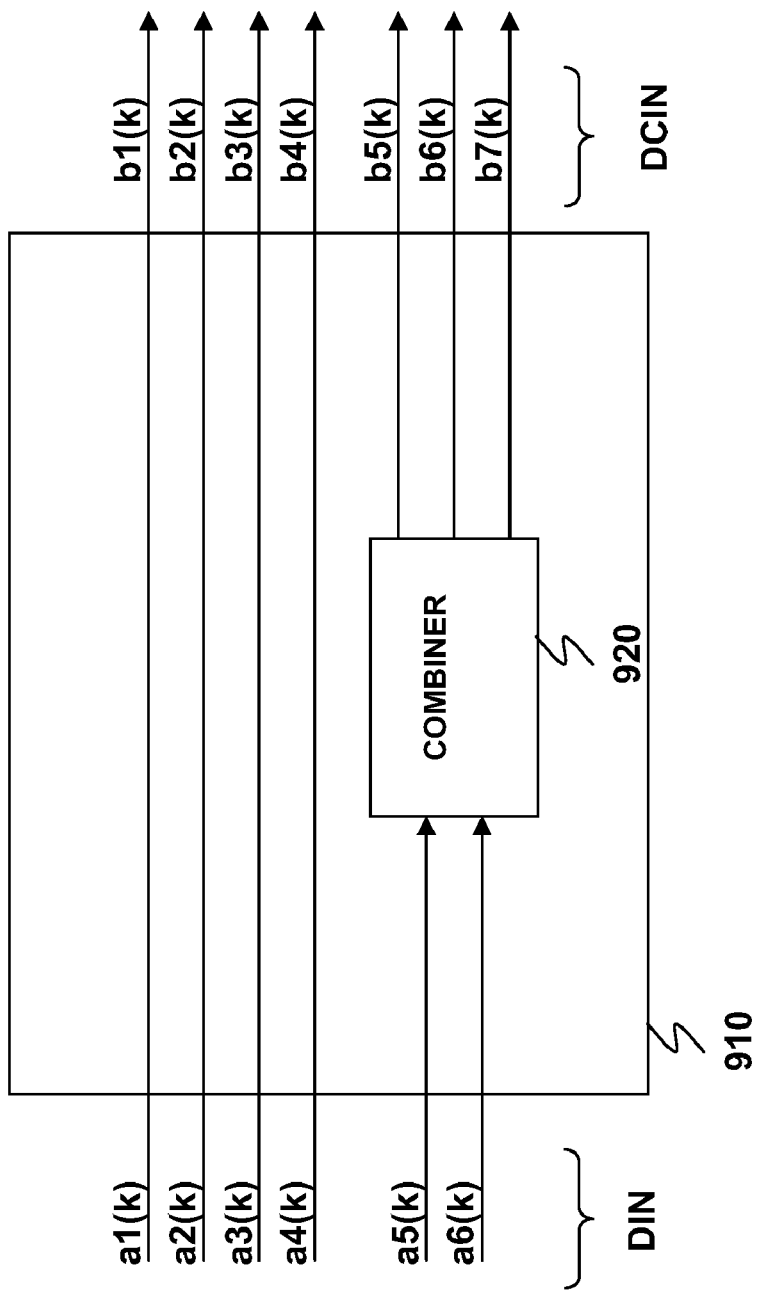
FIG. 9A is a block diagram of an encoding unit, according to another embodiment.
Figure 9B:
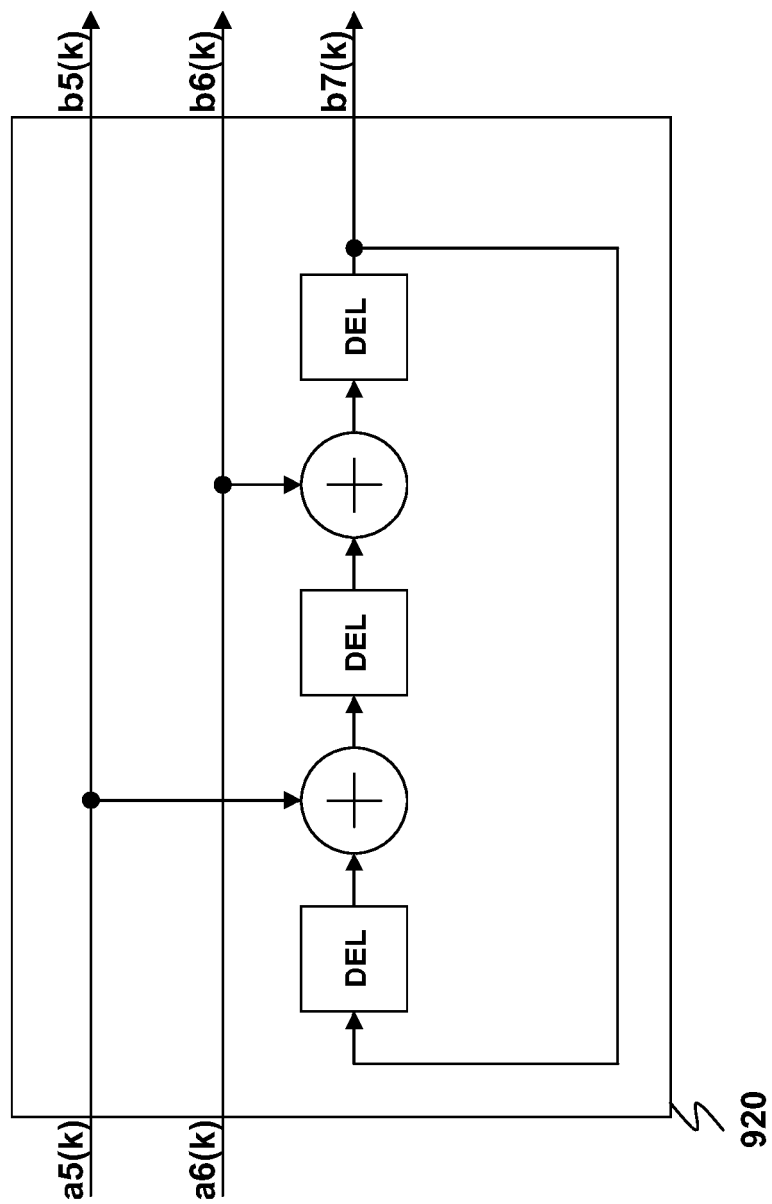
FIG. 9B is a block diagram of a linear combiner unit, according to another embodiment.

Because of limits introduced by tolerances intrinsic to memory cells, a number of program distributions such as sixteen, described in the example above, may be excessive, and may lead to excessive overlapping among adjacent program distributions. An approach to store a same number of bits of information using a lower number of program distributions may involve encoding the information to be stored in blocks corresponding to more than one memory cell. In this way, a redundancy defined by the code may be subdivided among the memory cells corresponding to the blocks. Consequently, the number of program distributions to which each memory cell may be programmed may be reduced. An example of how such a solution may be implemented is discussed with reference to FIGS. 9A, 9B, and 9C. In a particular example, information to be stored in memory may comprise blocks of six bits of information, wherein each block of six bits may be stored in a corresponding pair of addressed memory cells 110. For this purpose, encoding unit 130 may be modified, resulting in encoding unit 910, for example. In a particular implementation, signal DIN to be stored in a pair of addressed memory cells 110 may be represented by a string of six bits a1($k$), a2($k$), a3($k$), a4($k$), a5($k$), a6($k$). Encoding unit 910 may encode the six-bit string forming signal DIN to obtain encoded signal DCIN. Encoding unit 910 may comprise a convolutional encoder that uses a linear encoding scheme to add redundancy to signal DIN. In this case, however, redundancy introduced by encoding unit 910 may comprise one bit per pair of memory cells 110. Each six-bit string a1($k$), a2($k$), a3($k$), a4($k$), a5($k$), a6($k$) forming signal DIN may be encoded into a corresponding seven-bit symbol b1($k$), b2($k$), b3($k$), b4($k$), b5($k$), b6($k$), b7($k$) forming encoded signal DCIN. Such a seven-bit symbol b1($k$), b2($k$), b3($k$), b4($k$), b5($k$), b6($k$), b7($k$) may then be provided to read-program unit 115 to be stored in the pair of memory cells 110 addressed by the address code ADR. According to an embodiment, bits b1($k$), b2($k$), b3($k$), b4($k$) may coincide with bits a1($k$), a2($k$), a3($k$), a4($k$), while bits b5($k$), b6($k$), b7($k$) may be generated by a linear combiner 920 from bits a5($k$), a6($k$), as shown in FIG. 9B. Since the six-bit string a1($k$), a2($k$), a3($k$), a4($k$), a5($k$), a6($k$) may be encoded into a corresponding seven-bit symbol b1($k$), b2($k$), b3($k$), b4($k$), b5($k$), b6($k$), b7($k$), each pair of memory cells 110 may be programmed into $2^7$=128 different states.

Accordingly, each memory cell 110 of the addressed pair may be programmed into a corresponding one among twelve different states, corresponding to respective twelve program distributions E0, E1, . . . , E11 (for the first memory cell of the pair) and F0, F1, . . . , F11 (for the second memory cell of the pair). In this way, each one among 128 different states to which each pair of memory cells 110 is to be capable of being programmed, may be associated with a corresponding one among the 12*12=144 states defined by program distributions pairs Ei, Fj (i=1 to 11, j=1 to 11). Accordingly, with such values, 144−128=16 distribution pairs Ei, Fj need not be used.

Figure 9C:
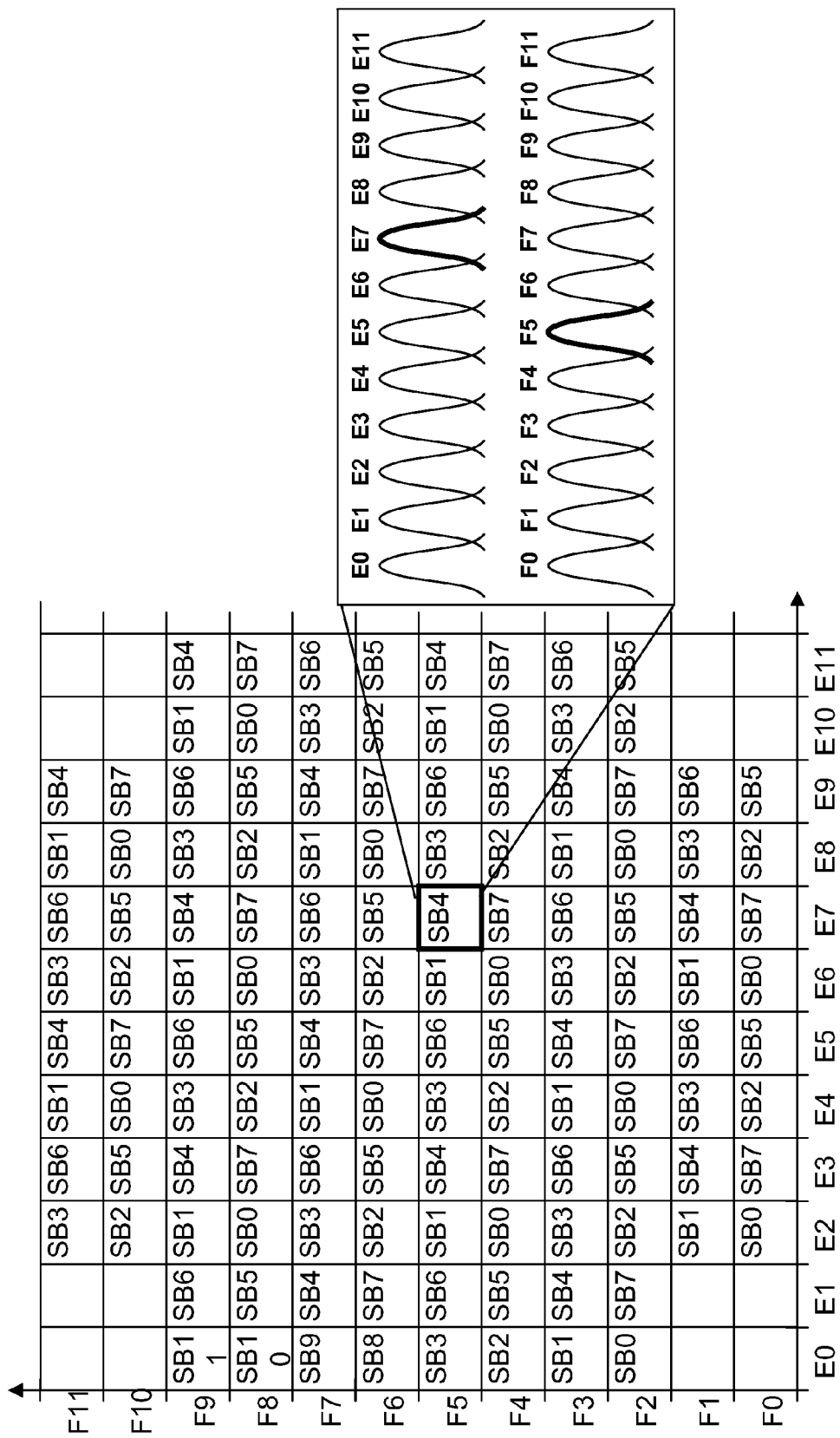
FIG. 9C is a schematic diagram showing programming partitioned into subsets, according to an embodiment.

The relationship between the 128 states identified by the values of bits b1($k$), b2($k$), b3($k$), b4($k$), b5($k$), b6($k$), b7($k$) and the program distributions pairs Ei, Fj may be defined by a mapping unit (not shown) included in the encoding unit 910 or in the read-program unit 115. Even in this case, the association between the 128 states defined by bits b1($k$), b2($k$), b3($k$), b4($k$), b5($k$), b6($k$), b7($k$) and various program distributions pairs Ei, Fj may involve a subset partitioning. More particularly, as shown in FIG. 9C, the 128 states may be partitioned into $2^3$=8 different subsets SB0, SB1, SB2, SB3, SB4, SB5, SB6, SB7, each one including $2^4$=16 program distributions pairs Ei, Fj. Each subset may be identified by a corresponding value of string b5($k$), b6($k$), b7($k$) generated by linear combiner 920. Moreover, within each subset SB0, SB1, SB2, SB3, SB4, SB5, SB6, SB7, the "distance" between various program distributions pairs Ei, Fj may be increased in such a way as to avoid any overlap between program distributions of the same subset.

FIG. 10 is a schematic view of a computing system and a memory device, according to an embodiment. Such a computing device may comprise one or more processors, for example, to execute an application and/or other code. For example, memory device 810 may comprise memory 100 shown in FIG. 1. A computing device 804 may be representative of any device, appliance, or machine that may be configurable to manage memory device 810. Memory device 810 may include a memory controller 815 and a memory 822. By way of example but not limitation, computing device 804 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 800 may be implemented using or otherwise including hardware, firmware, software, or any combination thereof. Thus, by way of example but not limitation, computing device 804 may include at least one processing unit 820 that is operatively coupled to memory 822 through a bus 840 and a host or memory controller 815. Processing unit 820 is representative of one or more circuits configurable to perform at least a portion of a data computing procedure or process. By way of example but not limitation, processing unit 820 may include one or more processors, controllers, microprocessors, microcontrollers, application specific integrated circuits, digital signal processors, programmable logic devices, field programmable gate arrays, and the like, or any combination thereof. Processing unit 820 may include an operating system configured to communicate with memory controller 815. Such an operating system may, for example, generate commands to be sent to memory controller 815 over bus 840. Such commands may comprise read and/or write commands. In response to a write command, for example, memory controller 815 may provide a bias signal, such as a set or reset pulse to write information associated with the write command to a memory partition, for example. In an implementation, memory controller 815 may operate memory device 810, wherein processing unit 820 may host one or more applications and/or initiate write commands to the memory controller to provide access to memory cells in memory device 810, for example.

In one embodiment, a system may comprise a memory device comprising a memory array to store information across one or more multilevel memory cells, a controller to apply a soft decision and convolutional encoding to the memory array to determine a value of the information, and a memory device controller to operate the memory device. The system may further comprise a processor to host one or more applications and to initiate write and/or read commands to the memory device controller to provide access to the memory array.

Memory 822 is representative of any data storage mechanism. Memory 822 may include, for example, a primary memory 824 and/or a secondary memory 826. Primary memory 824 may include, for example, a random access memory, read only memory, etc. While illustrated in this example as being separate from processing unit 820, it should be understood that all or part of primary memory 824 may be provided within or otherwise co-located/coupled with processing unit 820.

Secondary memory 826 may include, for example, the same or similar type of memory as primary memory and/or one or more data storage devices or systems, such as, for example, a disk drive, an optical disc drive, a tape drive, a solid state memory drive, etc. In certain implementations, secondary memory 826 may be operatively receptive of, or otherwise configurable to couple to, a computer-readable medium 828. Computer-readable medium 828 may include, for example, any medium that can carry and/or make accessible data, code, and/or instructions for one or more of the devices in system 800.

Computing device 804 may include, for example, an input/output 832. Input/output 832 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 832 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
   storing states in one or more multilevel memory cells, said storing states comprising encoding said states according to a convolutional code to provide symbols representing said states; and
   determining said encoded states using soft decision and convolutional decoding, wherein determining further comprises:
   reading soft decisions associated with sensed threshold voltages from the multilevel memory cells;
   maintaining sets of periodic functions, wherein each set is associated with a different plurality of program distributions of stored states, wherein the stored states associated with a particular periodic function are periodic with respect to one another;
   associating a soft decision with a particular set of the periodic functions; and
   selecting a program distribution from the particular set of periodic functions based at least partly on a calculation of a most probable encoding path that had been followed for encoding.

2. The method of claim 1, wherein said determining said encoded states further comprises:
   retrieving said stored states from said stored values and applying said soft decision and convolutional decoding to recover said stored states.

3. The method of claim 1, wherein said soft decision comprises determining a most probable program state among a plurality of program states to determine said encoded states.

4. The method of claim 1, wherein said multilevel memory cells are capable of storing two or more bits.

5. The method of claim 1, wherein said values comprise a measurement of a probability that a sensed threshold voltage belongs to a particular program distribution of said one or more multilevel memory cells.

6. A memory device comprising:
   a memory array to store states across one or more multilevel memory cells; and
   a controller configured to:
   encode said states according to a convolutional code to provide symbols representing said states;
   read soft decisions associated with sensed threshold voltages from the multilevel memory cells;
   access sets of periodic functions, wherein each set is associated with a different plurality of program distributions of stored states, wherein the stored states associated with a particular periodic function are periodic with respect to one another;
   associate a soft decision with a particular set of the periodic functions; and
   select a program distribution from the particular set of periodic functions based at least partly on a calculation of a most probable encoding path that had been followed for encoding to determine said encoded states using soft decision and convolutional decoding.

7. The memory device of claim 6, wherein said soft decision comprises determining a most probable program state among a plurality of program states to determine said encoded states.

8. The memory device of claim 6, further comprising:
   a sensing circuit to determine said threshold voltages of said one or more multilevel memory cells; and
   a converter to convert said values to a digital sequence of numbers indicating said threshold voltages of said one or more multilevel memory cells.

9. The memory device of claim 8, wherein said sensing circuit comprises a voltage comparator having multiple inputs to receive a bit line voltage corresponding to one of said one or more multilevel memory cells and a reference voltage.

10. The memory device of claim 6, wherein said multilevel memory cells are capable of storing two or more bits.

11. The memory device of claim 6, further comprising:
    a decoding unit to generate said values to quantify a probability that a sensed threshold voltage belongs to a particular program distribution of said one or more multilevel memory cells.

12. A system comprising:
    a memory device comprising:
    a memory array configured to store states across one or more multilevel memory cells, and
    a controller configured to:
    encode said states according to a convolutional code to provide symbols representing said states;
    read soft decisions associated with sensed threshold voltages from the multilevel memory cells;
    access sets of periodic functions, wherein each set is associated with a different plurality of program distributions of stored states, wherein the stored states associated with a particular periodic function are periodic with respect to one another;
    associate a soft decision with a particular set of the periodic functions; and
    select a program distribution from the particular set of periodic functions based at least partly on a calculation of a most probable encoding path that had been followed for encoding to determine said stored states using soft decision and convolutional decoding; and
    a processor to host one or more applications and to initiate write and/or read commands to said memory device controller to provide access to said memory array.

13. The system of claim 12, wherein said soft decision comprises determining a most probable program state among a plurality of program states to determine said stored states.

14. The system of claim 12, further comprising:
    a sensing circuit to determine said threshold voltages of said one or more multilevel memory cells; and
    a converter to convert said values to a digital sequence of numbers indicating said threshold voltages of said one or more multilevel memory cells.

15. The system of claim 14, wherein said sensing circuit comprises a voltage comparator having multiple inputs to receive a bit line voltage corresponding to one of said one or more multilevel memory cells and a reference voltage.

16. The system of claim 12, wherein said convolutional encoding comprises Viterbi encoding.

17. The system of claim 12, further comprising:

a decoding unit to generate said values to quantify a probability that a sensed threshold voltage belongs to a particular program distribution of said one or more multilevel memory cells.

18. The method of claim 1, further comprising storing said values as multi-bit strings in said one or more multilevel memory cells.

19. The method of claim 18, wherein said storing said values as multibit strings in said one or more multilevel memory cells further comprises storing said values as multi-bit strings in two or more of said multilevel memory cells.

20. The memory device of claim 6, wherein said controller is further adapted to store said values as multi-bit strings in said one or more multilevel memory cells.

21. The method of claim 1, wherein the sets of periodic functions are maintained in a lookup table.

22. The memory device of claim 6, further comprising a look-up table configured to store the sets of periodic functions.

23. The system of claim 12, further comprising a look-up table configured to store the sets of periodic functions.

\* \* \* \* \*

UNITED STATES PATENT AND TRADEMARK OFFICE
CERTIFICATE OF CORRECTION

PATENT NO. : 8,386,895 B2
APPLICATION NO. : 12/783483
DATED : February 26, 2013
INVENTOR(S) : Marco Maccarrone et al.

It is certified that error appears in the above-identified patent and that said Letters Patent is hereby corrected as shown below:

On Title Page, Item (75), under "Inventors", column 1, line 2, Delete "Catronno" and insert -- Castronno --, therefor.

In the Claims:
In column 19, line 24, in Claim 1, after "states;" delete "and".

Signed and Sealed this
Thirtieth Day of April, 2013

Teresa Stanek Rea
*Acting Director of the United States Patent and Trademark Office*